(12) United States Patent
Lee et al.

(10) Patent No.: US 8,112,574 B2
(45) Date of Patent: Feb. 7, 2012

(54) SWAPPABLE SETS OF PARTIAL-MAPPING TABLES IN A FLASH-MEMORY SYSTEM WITH A COMMAND QUEUE FOR COMBINING FLASH WRITES

(75) Inventors: Charles C. Lee, Cupertino, CA (US);
Frank Yu, Palo Alto, CA (US);
Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 589 days.

(21) Appl. No.: 12/347,306

(22) Filed: Dec. 31, 2008

(65) Prior Publication Data

US 2009/0113121 A1 Apr. 30, 2009

Related U.S. Application Data

(63) Continuation-in-part of application No. 12/254,428, filed on Oct. 20, 2008, now Pat. No. 7,849,242, and a continuation-in-part of application No. 12/128,916, filed on May 29, 2008, now Pat. No. 7,552,251, and a continuation-in-part of application No. 12/035,398, filed on Feb. 21, 2008, now Pat. No. 7,953,931, and a continuation-in-part of application No. 12/025,706, filed on Feb. 4, 2008, now Pat. No. 7,886,108, and a continuation-in-part of application No. 11/871,011, filed on Oct. 11, 2007, now Pat. No. 7,934,074, and a continuation-in-part of application No. 11/770,642, filed on Jun. 28, 2007, now Pat. No. 7,889,544, and a continuation-in-part of application No. 11/748,595, filed on May 15, 2007, now Pat. No. 7,471,556, and a continuation-in-part of application No. 11/466,759, filed on Aug. 23, 2006, now Pat. No. 7,702,831, and a continuation-in-part of application No. 10/818,653, filed on Apr. 5, 2004, now Pat. No. 7,243,185, and a continuation-in-part of application No. 10/803,597, filed on Mar. 17, 2004, now Pat. No. 7,457,897, and a continuation-in-part of application No. 10/789,333, filed on Feb. 26, 2004, now Pat. No. 7,318,117.

(51) Int. Cl.
*G06F 12/10* (2006.01)

(52) U.S. Cl. ........................................ 711/103; 202/206

(58) Field of Classification Search ........................ None
See application file for complete search history.

(56) References Cited

U.S. PATENT DOCUMENTS 5,963,983 A * 10/1999 Sakakura et al. .............. 711/202
6,377,500 B1 * 4/2002 Fujimoto et al. ......... 365/230.01

(Continued)

*Primary Examiner* — Kaushikkumar Patel
(74) *Attorney, Agent, or Firm* — Stuart T. Aavinen; gPatent LLC

(57) ABSTRACT

A flash controller has a flash interface accessing physical blocks of multi-level-cell (MLC) flash memory. An Extended Universal-Serial-Bus (EUSB) interface loads host commands into a command queue where writes are re-ordered and combined to reduce flash writes. A partial logical-to-physical L2P mapping table in a RAM has entries for only 1 of N sets of L2P mapping tables. The other N−1 sets are stored in flash memory and fetched into the RAM when a L2P table miss occurs. The RAM required for mapping is greatly reduced. A data buffer stores one page of host write data. Sector writes are merged using the data buffer. The data buffer is flushed to flash when a different page is written, while the partial logical-to-physical mapping table is flushed to flash when a L2P table miss occurs, when the host address is to a different one of the N sets of L2P mapping tables.

14 Claims, 22 Drawing Sheets

U.S. PATENT DOCUMENTS

| | | | |
|---|---|---|---|
| 2004/0186946 A1* | 9/2004 | Lee | 711/103 |
| 2007/0038793 A1* | 2/2007 | Wehage et al. | 710/305 |
| 2007/0268754 A1* | 11/2007 | Lee et al. | 365/185.29 |
| 2008/0104264 A1* | 5/2008 | Duerk et al. | 709/230 |
| 2008/0126683 A1* | 5/2008 | Tsuji | 711/103 |
| 2008/0162793 A1* | 7/2008 | Chu et al. | 711/103 |
| 2008/0195801 A1* | 8/2008 | Cheon et al. | 711/103 |
| 2008/0250202 A1* | 10/2008 | Conley et al. | 711/115 |
| 2010/0030999 A1* | 2/2010 | Hinz | 711/206 |
| 2011/0060874 A1* | 3/2011 | Tanaka | 711/103 |

* cited by examiner

| ENTRY # | PBA | PAGE-RESIDENT FLAGS | | | |
|---|---|---|---|---|---|
| | | P0 | P1 | P2 | P3 |
| E0 | PBA = 0A05 | 1 | 0 | 1 | 1 |
| E1 | PBA = 0003 | 1 | 1 | 0 | 0 |
| E2 | PBA = 07CF | 0 | 0 | 1 | 0 |
| E3 | PBA = 0000 | 0 | 0 | 0 | 0 |

L2P MODIFIED FLAG: 0

L2P SET #: L2P SET = 00008

STORED PAGE # FOR DATA BFR: P3

STORED ENTRY # FOR DATA BFR: E0

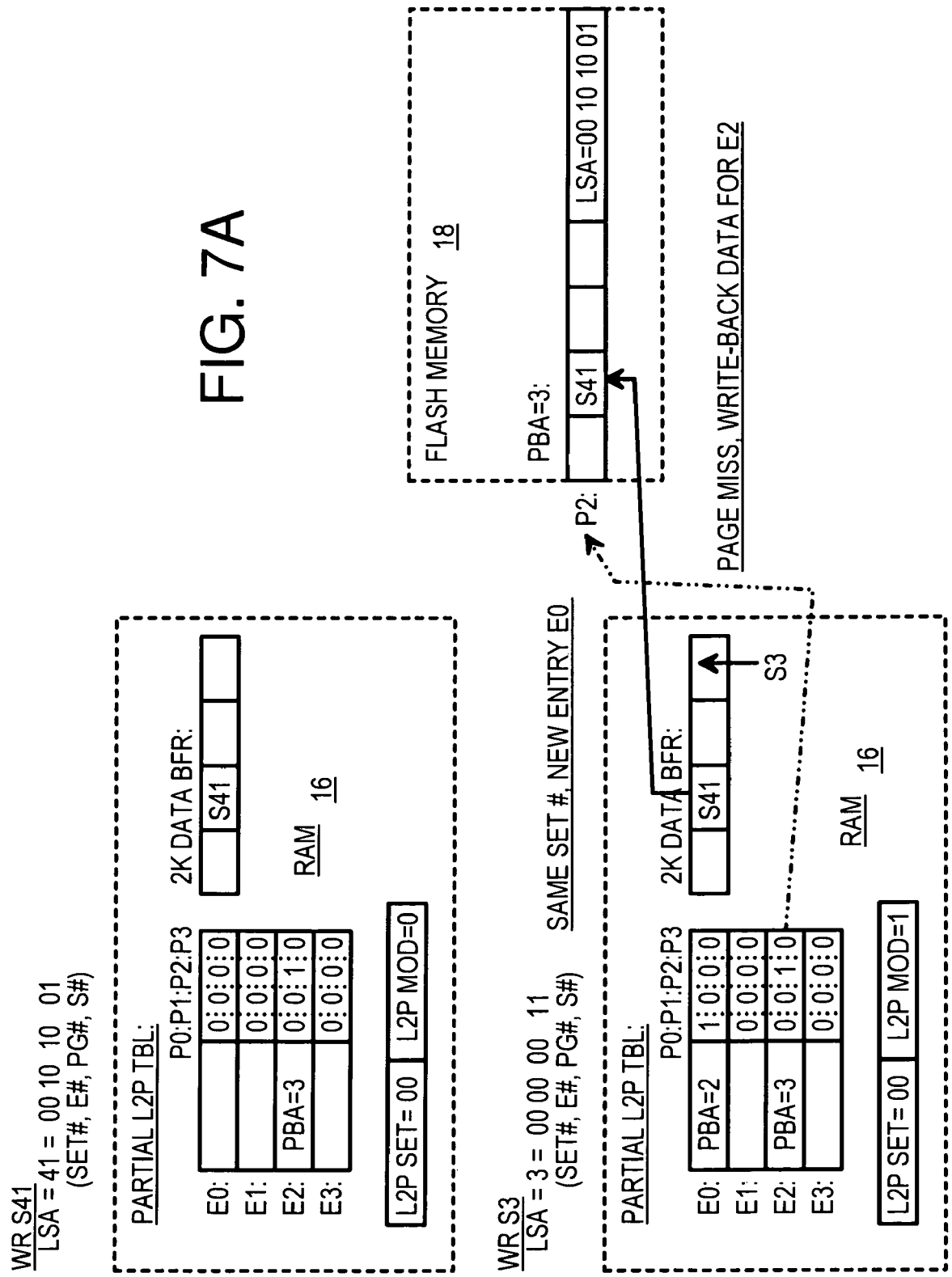

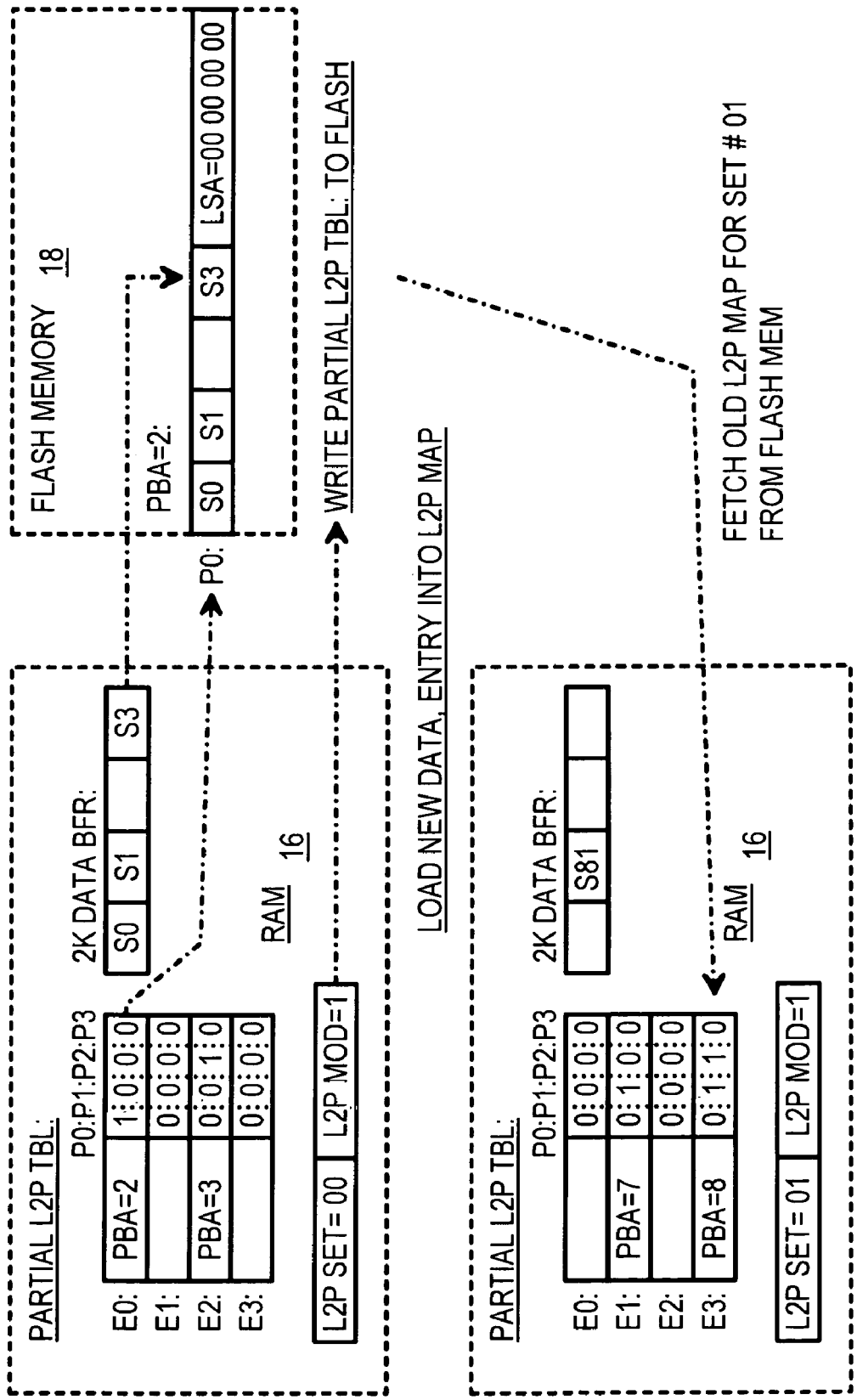

FIG. 10A

CMD QUEUE 11

| SEQ ID | START LBA,PG#,S# | SC | ENDING LBA,PG#,S# | START BFR ADDR | ENDING BFR ADDR |
|---|---|---|---|---|---|
| 1 | 5,3,2 | 4 | 6,0,1 | 0 | 3 |

← WR PTR
← RD PTR

FIG. 10B

CMD QUEUE 11

| SEQ ID | START LBA,PG#,S# | SC | ENDING LBA,PG#,S# | START BFR ADDR | ENDING BFR ADDR |
|---|---|---|---|---|---|
| 2 | 5,3,3 | 2 | 6,0,0 | X | X |
| 1 | 5,3,2 | 4 | 6,0,1 | 0 | 3 |

← WR PTR
← RD PTR

FIG. 10C

ERASE ENTRY SID=2, OVER-WRITE SECTOR DATA IN DATA BFR

FULLY OVERLAPPING ENTRY

CMD QUEUE 11

| SEQ ID | START LBA,PG#,S# | SC | ENDING LBA,PG#,S# | START BFR ADDR | ENDING BFR ADDR |
|---|---|---|---|---|---|
| 1 | 5,3,2 | 4 | 6,0,1 | 0 | 3 |

← WR PTR
← RD PTR

FIG. 10D

CMD QUEUE 11

| SEQ ID | START LBA,PG#,S# | SC | ENDING LBA,PG#,S# | START BFR ADDR | ENDING BFR ADDR |
|---|---|---|---|---|---|
| 3 | 6,0,1 | 3 | 6,0,3 | X | X |
| 1 | 5,3,2 | 4 | 6,0,1 | 0 | 3 |

WR PTR ↑ (bottom) RD PTR ↓ (top)

PARTIAL OVERLAP: MODIFY ENTRY

FIG. 10E

CMD QUEUE 11

| SEQ ID | START LBA,PG#,S# | SC | ENDING LBA,PG#,S# | START BFR ADDR | ENDING BFR ADDR |
|---|---|---|---|---|---|
| 3 | 6,0,2 | 2 | 6,0,3 | 4 | 5 |
| 1 | 5,3,2 | 4 | 6,0,1 | 0 | 3 |

WR PTR ↑  RD PTR ↓

FULL OVERLAP: DELETE ENTRY AND OVER-WRITE DATA BFR

FIG. 10F

CMD QUEUE 11

| SEQ ID | START LBA,PG#,S# | SC | ENDING LBA,PG#,S# | START BFR ADDR | ENDING BFR ADDR |
|---|---|---|---|---|---|
| 4 | 5,3,3 | 3 | 6,0,1 | X | X |
| 3 | 6,0,2 | 2 | 6,0,3 | 4 | 5 |
| 1 | 5,3,2 | 4 | 6,0,1 | 0 | 3 |

WR PTR ↑  RD PTR ↓

FIG. 10G

CMD QUEUE 11

| SEQ ID | START LBA,PG#,S# | SC | ENDING LBA,PG#,S# | START BFR ADDR | ENDING BFR ADDR |
|---|---|---|---|---|---|
| 3 | 6,0,2 | 2 | 6,0,3 | 4 | 5 |
| 1 | 5,3,2 | 4 | 6,0,1 | 0 | 3 |

WR PTR ↑   RD PTR ↓

FIG. 10H

COMBINE ENTRIES WITH SEQUENTIAL DATA

CMD QUEUE 11

| SEQ ID | START LBA,PG#,S# | SC | ENDING LBA,PG#,S# | START BFR ADDR | ENDING BFR ADDR |
|---|---|---|---|---|---|
| | | | | | |
| | | | | | |
| 1 | 5,3,2 | 6 | 6,0,3 | 0 | 5 |

WR PTR ↑   RD PTR ↓

SWAPPABLE SETS OF PARTIAL-MAPPING TABLES IN A FLASH-MEMORY SYSTEM WITH A COMMAND QUEUE FOR COMBINING FLASH WRITES

RELATED APPLICATION

This application is a continuation-in-part (CIP) of the co-pending application for "High Endurance Non-Volatile Memory Devices", U.S. Ser. No. 12/035,398, filed Feb. 21, 2008, which is a CIP of "High Speed Controller for Phase Change Memory Peripheral Devices", U.S. application Ser. No. 11/770,642, filed on Jun. 28, 2007, which is a CIP of "Local Bank Write Buffers for Acceleration a Phase Change Memory", U.S. application Ser. No. 11/748,595, filed May 15, 2007, now U.S. Pat. No. 7,471,556, which is CIP of "Flash Memory System with a High Speed Flash Controller", application Ser. No. 10/818,653, filed Apr. 5, 2004, now U.S. Pat. No. 7,243,185.

This application is also a CIP of the co-pending U.S. patent application for "Method and Systems of Managing Memory Addresses in a Large Capacity Multi-Level Cell (MLC) based Memory Device", Ser. No. 12/025,706, filed on Feb. 4, 2008, which is a CIP of "Flash Module with Plane-Interleaved Sequential Writes to Restricted-Write Flash Chips", Ser. No. 11/871,011, filed Oct. 11, 2007.

This application is also a CIP of the U.S. patent application for "Single-Chip Multi-Media Card/Secure Digital controller Reading Power-on Boot Code from Integrated Flash Memory for User Storage", Ser. No. 12/128,916, filed on May 29, 2008.

This application is also a CIP of "Flash Memory Controller for Electronic Data Flash Card" U.S. Ser. No. 11/466,759, filed Aug. 23, 2006, which is a CIP of "System and Method for Controlling Flash Memory", U.S. Ser. No. 10/789,333, filed Feb. 26, 2004, now U.S. Pat. No. 7,318,117.

This application is also a CIP of "PCI Express Compatible Controller and Interface for Flash Memory", Ser. No. 10/803,597, filed on Mar. 17, 2004, now U.S. Pat. No. 7,457,897, and is a CIP of the divisional application for "PCI Express Compatible Controller and Interface for Flash Memory" Ser. No. 12/254,428, filed on Oct. 20, 2008.

FIELD OF THE INVENTION

This invention relates to flash-memory systems, and more particularly to partial logical-to-physical mapping tables and command queuing.

BACKGROUND OF THE INVENTION

Large amounts of data are typically stored in mass-storage devices such as hard disk drives (HDD). A consumer may desire a large capacity flash-memory system, perhaps as a replacement for a hard disk. A solid-state disk (SSD) made from flash-memory chips has no moving parts and is thus more reliable than a rotating disk.

Mass-storage devices are block-addressable rather than byte-addressable, since the smallest unit that can be read or written is a page that is several 512-byte sectors in size. Flash memory is replacing hard disks and optical disks as the preferred mass-storage medium.

NAND flash memory is a type of flash memory constructed from electrically-erasable programmable read-only memory (EEPROM) cells, which have floating gate transistors. These cells use quantum-mechanical tunnel injection for writing and tunnel release for erasing. NAND flash is non-volatile so it is ideal for portable devices storing data. NAND flash tends to be denser and less expensive than NOR flash memory.

However, NAND flash has limitations. In the flash memory cells, the data is stored in binary terms—as ones (1) and zeros (0). One limitation of NAND flash is that when storing data (writing to flash), the flash can only write from ones (1) to zeros (0). When writing from zeros (0) to ones (1), the flash needs to be erased a "block" at a time. Although the smallest unit for read or program can be a byte or a word, the smallest unit for erase is a block.

Single Level Cell (SLC) flash and Multi Level Cell (MLC) flash are two types of NAND flash. The erase block size of SLC flash may be 128K+4K bytes while the erase block size of MLC flash may be 256K+8K bytes. Another limitation is that NAND flash memory has a finite number of erase cycles between 10,000 to 1,000,000, after which the flash wear out and becomes unreliable.

Comparing MLC flash with SLC flash, MLC flash memory has advantages and disadvantages in consumer applications. In the cell technology, SLC flash stores a single bit of data per cell, whereas MLC flash stores two or more bits of data per cell. MLC flash can have twice or more the density of SLC flash with the same technology. But the performance, reliability and durability may decrease for MLC flash.

Some MLC flash-memory chips have significant restrictions on writing. Samsung's K9G8G08U0M is a typical restrictive-write MLC flash chip. It has 2K data bytes per page, plus 64 spare bytes that can be used for ECC or other management purposes. There are 128 pages per flash block in this chip. The pages must be written in page order, not in a random order. The whole block of 128 pages must be erased together.

Write data from the host may be buffered by a flash memory controller before being written to the flash memory. For example, all pages in a block could be buffered in the flash memory controller before the whole block is written to flash memory.

However, MLC chips often have a huge number of pages per block. There may be 256 pages per block, and each page can have 8 sectors of 512-Kbytes each, plus spare areas. A buffer large enough to hold an entire block would exceed 1 GigaByte. Such a large buffer is prohibitively expensive for low-cost flash devices.

Smaller page-size buffers are much less expensive to include on the flash controller chip. However, when pages from the host are not in a sequential order, data that was already written to flash may need to be copied to a new block so that pages may be written in sequential order. Better algorithms and systems to manage and map pages to flash memory can reduce the penalty of out-of-order page writes.

Since the size of flash memory may be quite large, mapping tables can also explode in size. It may become too expensive to keep maps of the entire flash memory in the controller chip. Better algorithms and systems to manage these maps of flash memory can reduce the penalty for the mapping tables.

What is desired is a flash memory system that stores only partial maps in the controller chip. A flash controller that only partially maps logical host pages to physical flash pages is desirable to reduce storage requirements on the flash controller chip. Command queuing and re-ordering of commands from the host is also desirable when using partial logical-to-physical mapping tables.

BRIEF DESCRIPTION OF THE DRAWINGS

FIG. 5 highlights entries and a page map in a partial logical-to-physical mapping table.

FIGS. 7A-C show examples of host writes to flash memory using the partial logical-to-physical mapping table.

FIGS. 10A-H are examples of combining host commands using a command queue.

DETAILED DESCRIPTION

The present invention relates to an improvement in flash-memory controllers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
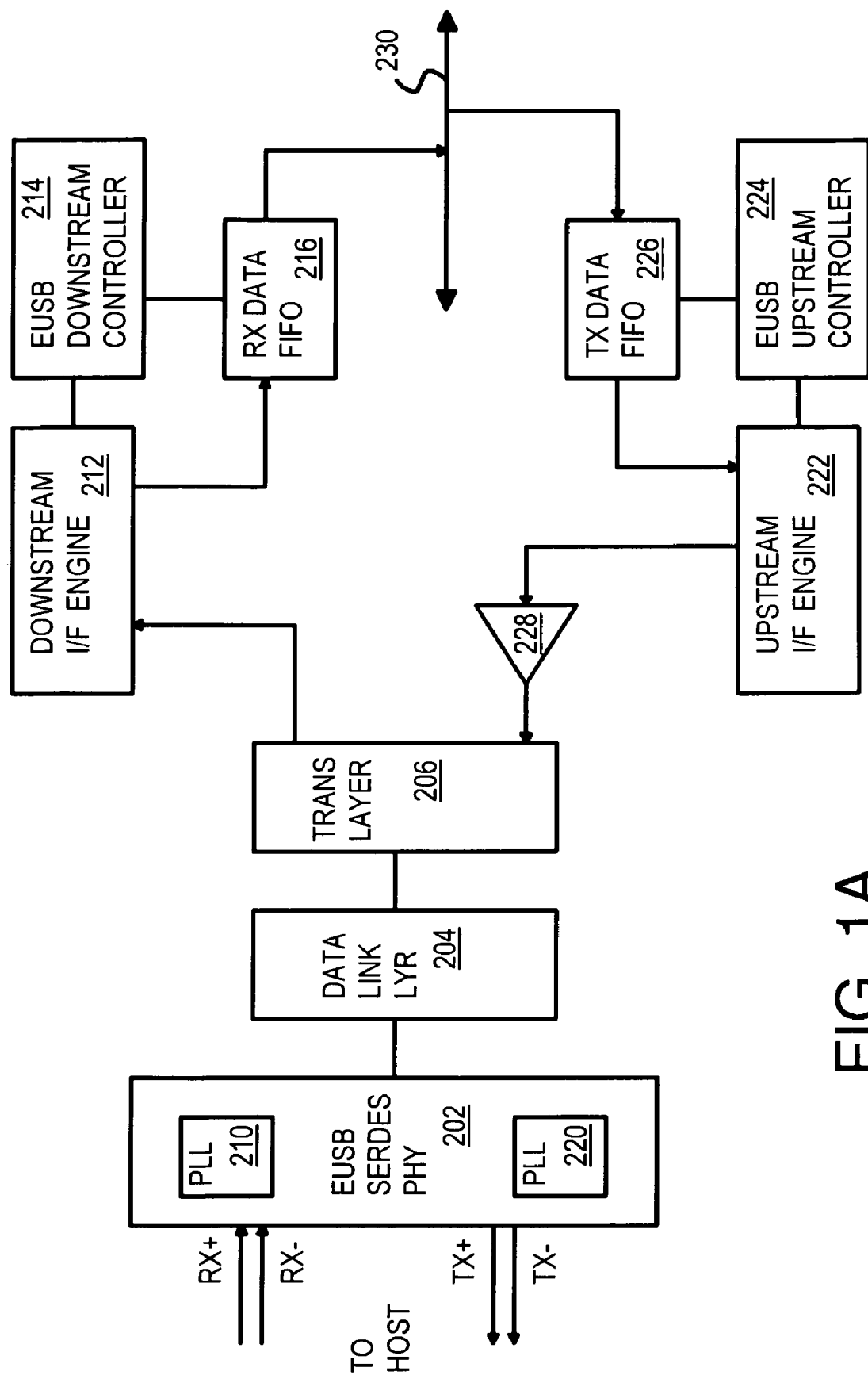
FIGS. 1A-B is a block diagram of a flash-memory system.
Figure 1B:
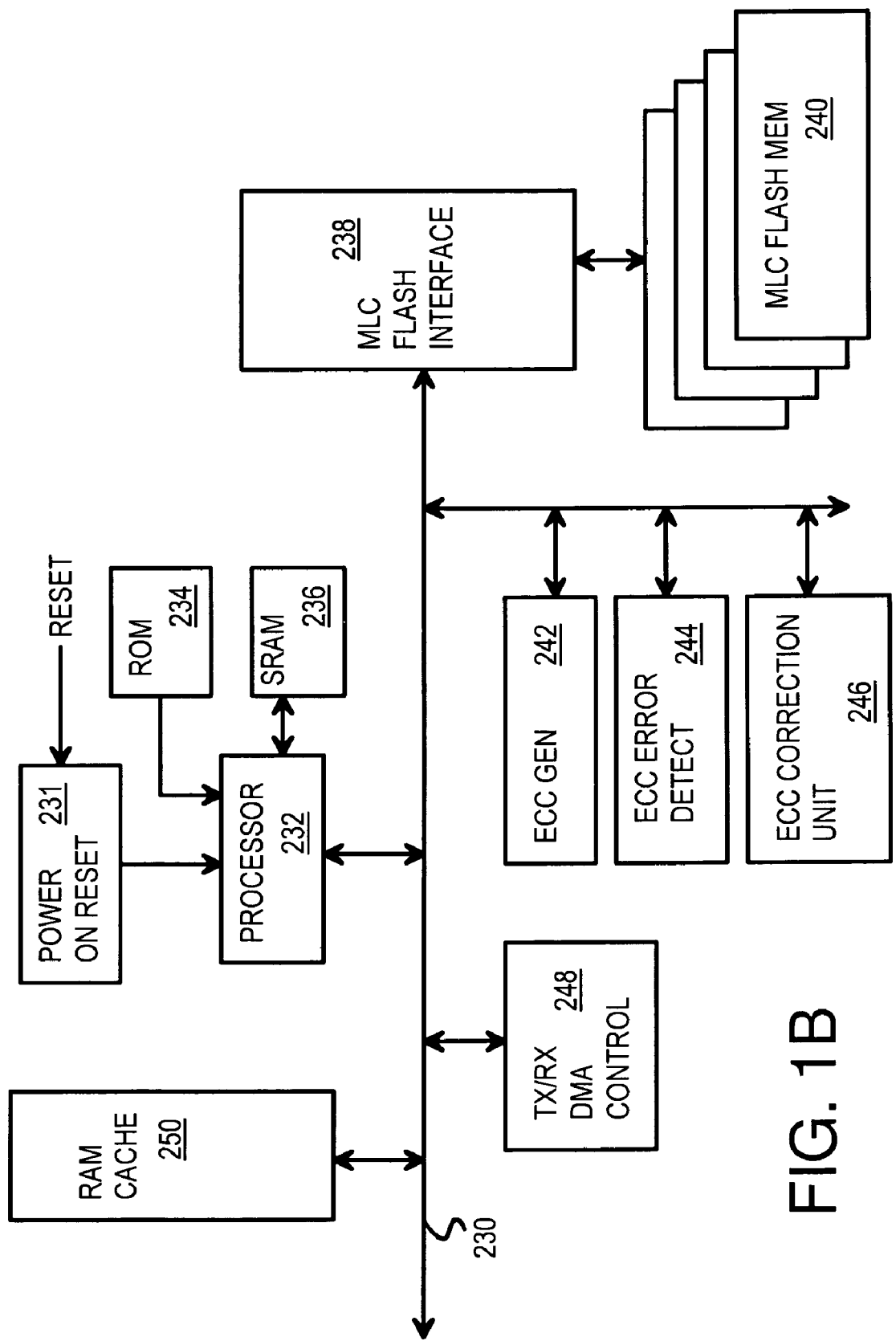

FIGS. 1A-B is a block diagram of a flash-memory system. A transmit and a receive differential pair connect to a host and to serial-deserializer 202. Phase-locked loops (PLL's) 210, 220 lock to data on each pair for high-speed signaling. The physical layer can use an extended Universal-Serial-Bus (EUSB) protocol such as USB 3.0, or some other physical signaling protocol. Data link layer 204 and transport layer 206 add and check error-detection code such as checksums and add and verify sequence numbers and framing using the EUSB protocol.

Incoming packets are processed by downstream interface engine 212, which is controlled by EUSB downstream controller 214. The received data is loaded into receive data FIFO 216 before being sent over internal bus 230.

Outgoing payload data from internal bus 230 are written into transmit data FIFO 226 for processing by upstream interface engine 222, which is controlled by EUSB upstream controller 224. The data packets formed by upstream interface engine 222 is driven by buffer 228 to transport layer 206 for transmission to the host.

In FIG. 1B, internal bus 230 stores data in RAM cache 250, which can be a synchronous dynamic-random-access memory (SDRAM), or a static random-access memory (SRAM), either integrated with the flash controller chip or separate from the chip. Data is moved over internal bus 230 by direct-memory access (DMA) controller 248, which can be programmed by processor 232. Processor 232 executes routines such as firmware from read-only memory (ROM) 234 or static random-access memory (SRAM) 236. Power-on reset circuit 231 resets processor 232 either when power is applied or when a reset signal is asserted.

MLC flash interface 238 drives flash-specific address/data and control signals to and from MLC flash memory 240. MLC flash interface 238 may have registers that are programmed over internal bus 230 by DMA controller 248 or by processor 232.

Error may occur when reading from MLC flash memory 240, especially when greater numbers of bits per cell are stored in the multi-level-cells (MLC's). For example, storing 4 bits per MLC cell is more error-prone than storing 2 bits per MLC cell since the noise margins are lower. ECC generator 242 generates error-correction code (ECC) from the data being written into MLC flash memory 240, and MLC flash interface 238 can store this ECC with the flash data in MLC flash memory 240.

When flash data is read out of MLC flash memory 240, ECC error detector 244 generates syndromes or other detection information from the ECC code and the data. When an error is detected, ECC correction unit 246 can be activated to attempt correction of the faulty data.

Figure 2:
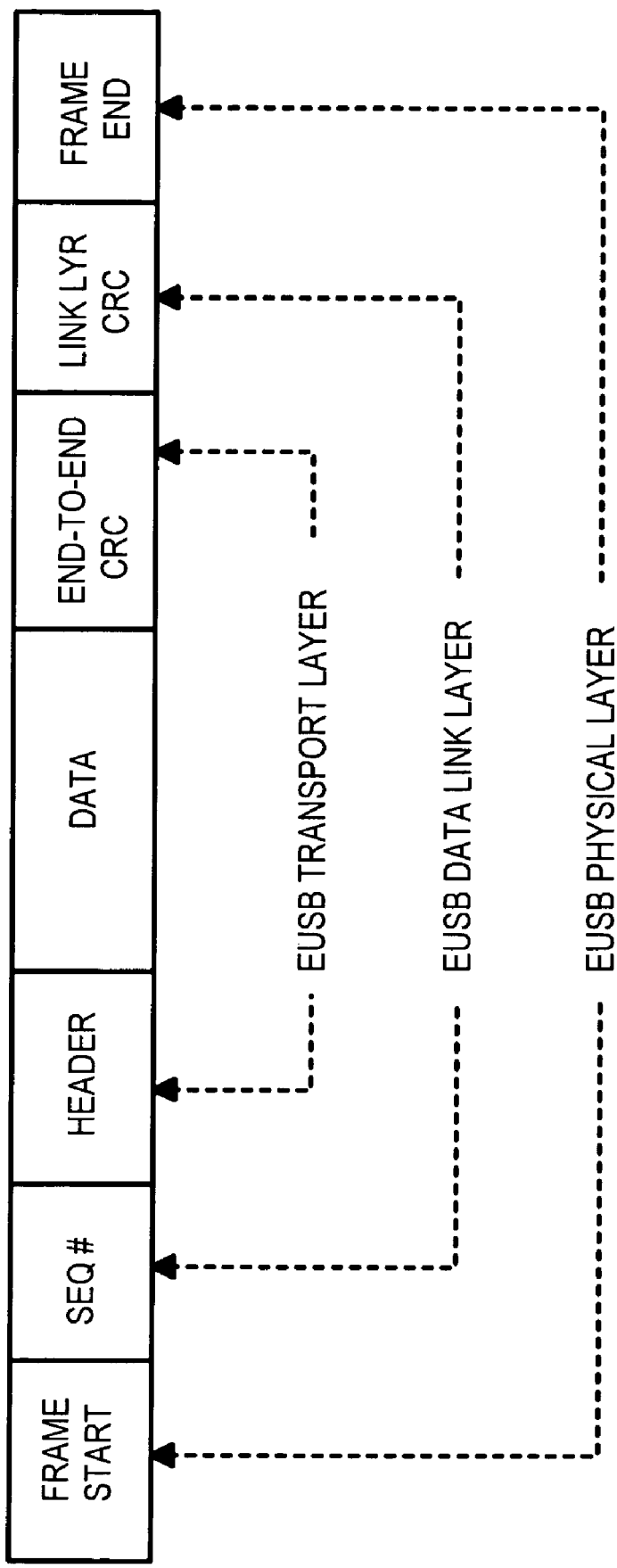
FIG. 2 shows an EUSB frame sent over the transmit or receive pair.

FIG. 2 shows an EUSB frame sent over the transmit or receive pair. The data payload is surrounded by a header and an end-to-end cyclical-redundancy-check (CRC) checksum by the EUSB transport layer. The EUSB data link layer adds a sequence number and a link-layer CRC to the transport packet. The transport packet may be divvied into several DLL packets with different sequence numbers that are re-assembled after reception. The EUSB physical layer performs framing by adding a frame-start sequence and a frame-end sequence before transmission over the differential pair.

Framing can be performed by serial-deserializer 202 of FIG. 1, while the data-link-layer processing is performed by data link layer 204 of FIG. 1. Transport layer 206 of FIG. 1 creates the header and end-to-end CRC for outgoing packets, and strips off the header and CRC of incoming packets. Hard-wired logic or a programmable processor may be used to implement serial-deserializer 202, data link layer 204, and transport layer 206.

Figure 3:
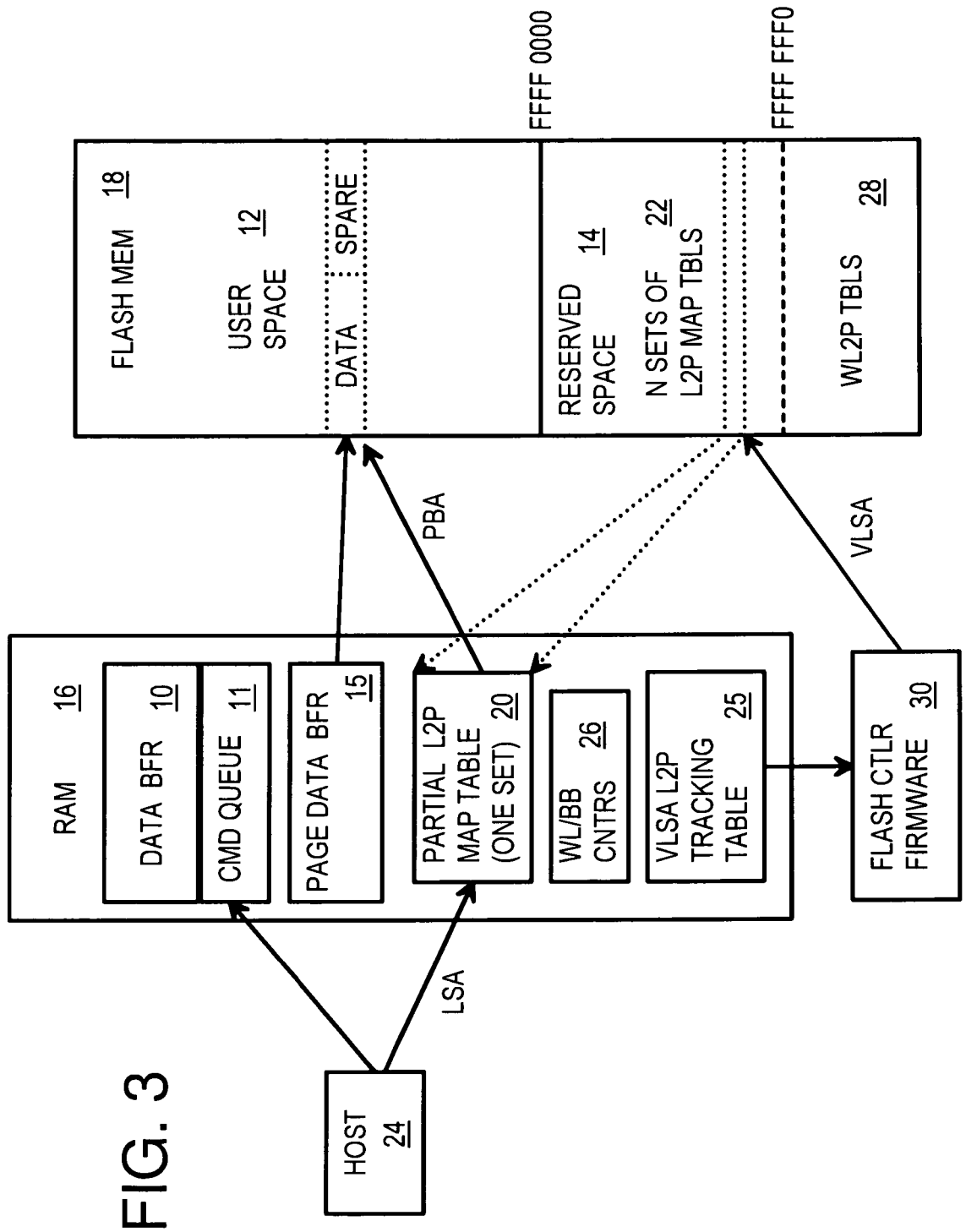
FIG. 3 highlights partial mapping tables and buffering in a flash system.

FIG. 3 highlights partial mapping tables and buffering in a flash system. Host 24 writes one or more sectors of data to flash using a logical-sector address (LSA) to identify the sector. The sectors of data are initially stored in data buffer 10, which can store multiple sectors of data. The host command information, including the LSA, is stored in command queue 11, which allows for host commands to be re-ordered before writing to flash memory 18 through page data buffer 15. Re-ordering by command queue 11 can improve performance when out-of-sequence writes occur, since these writes can be re-arranged into sequential page order before writing to flash memory 18.

The LSA is applied to partial logical-to-physical mapping table 20, which stores only one partial set of the mapping tables. The full N sets of partial logical-to-physical (L2P) mapping tables are stored in reserved space 14 of flash memory 18. Reserved space 14 of flash memory 18 is not visible to host 24. For example, reserved space 14 could be physical addresses above FFFF 0000. Alternately, reserved space 14 could be physically combined with user space 12 in flash memory 18, being simply physical blocks that are not mapped to user space 12.

There are a total of N sets of partial logical-to-physical mapping tables stored in flash memory 18 as N sets of partial logical-to-physical mapping tables 22. Only one of these N sets of mapping tables is loaded into RAM 16 at any one time. This drastically reduces the space required in RAM 16 for mapping tables, although sometimes mapping tables must be fetched from flash memory 18, and updated mapping information from partial logical-to-physical mapping table 20 be written back to one of the N sets of partial logical-to-physical mapping tables 22 in flash memory 18. RAM 16 can be RAM cache 250 of FIG. 1B.

When the host LSA is applied to partial logical-to-physical mapping table 20, a physical block address (PBA) is obtained that points to a physical block in user space 12 of flash memory 18. This physical block has a data area and a spare area. The spare area can store ECC, the LSA from host 24, valid bits, and other management information.

Wear-leveling and bad-block counters 26 in RAM 16 count the number of times that a physical block in flash memory 18 has been erased. Blocks that have too many errors can be marked as bad, such as by setting the erase count to a very high value. Wear-leveling and bad-block counters 26 contain only a subset of the total number of counters that are stored in flash memory 18 as wear-leveling-to-physical (WL2P) tables 28. These tables can be stored at a specific address, such as above FFFF FFF0, or can be stored in physical blocks located anywhere in flash memory 18.

Flash controller firmware 30 can be code running on processor 232 of FIG. 1B, and can include various management routines. For example, a routine can be called to fetch a different set of the N sets of partial logical-to-physical mapping tables 22 from flash memory 18 and write that set to partial logical-to-physical mapping table 20 when a miss occurs in partial logical-to-physical mapping table 20. A virtual logical-sector address (VLSA) that is outside the LSA address space of host 24 can be generated by flash controller firmware 30 using L2P tracking table 25. The old set# for the old entries in partial logical-to-physical mapping table 20 is looked up in L2P tracking table 25 to find the PBA of the old set of entries in N sets of partial logical-to-physical mapping tables 22 in flash memory 18. L2P tracking table 25 can be part of wear-leveling and bad-block counters 26 in RAM 16, or may be a separate table with the PBA's for each of the N sets of partial logical-to-physical mapping tables 22 in flash memory 18.

Figure 4:
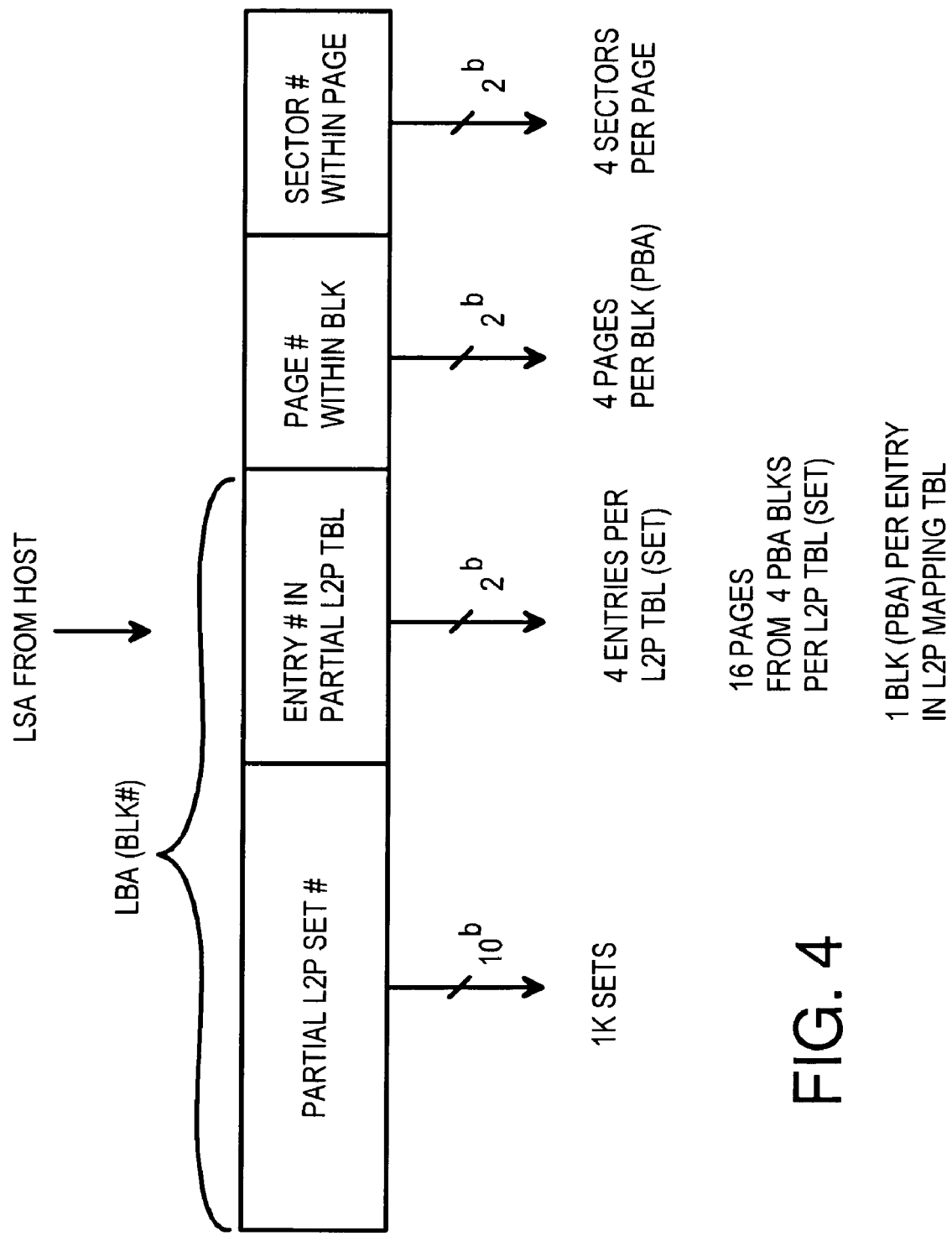
FIG. 4 shows a partial set number extracted from a logical-sector address (LSA) from a host.

FIG. 4 shows a partial set number extracted from a logical-sector address (LSA) from a host. The LSA from the host has a sector number within a page, and a page number within a logical block. The logical block is identified by a logical block number address (LBA) and includes the most-significant bits of the LSA.

The LBA is divided into an entry number and a partial L2P set number. The entry number points to one of the entry locations in partial logical-to-physical mapping table 20 (FIG. 3). The entry number is an index into partial logical-to-physical mapping table 20. The partial L2P set number identifies one of the N sets. When the set number for the entries currently stored in partial logical-to-physical mapping table 20 does not match the set number from the LSA, a mapping miss occurs, and the entries in partial logical-to-physical mapping table 20 must be copied to N sets of partial logical-to-physical mapping tables 22 in flash memory 18, and a new set from N sets of partial logical-to-physical mapping tables 22 copied into RAM 16 to load partial logical-to-physical mapping table 20.

For example, a 16-bit LSA can have a 10-bit set number, that selects one of 1K sets from N sets of partial logical-to-physical mapping tables 22 in flash memory 18. Partial logical-to-physical mapping table 20 can have 4 entries, so the entry number is 2 bits of the LSA. Two more bits can select one of four pages per block, and the 2 LSB's can select one sector per 2K-byte page. The physical page number can be set to be the same as the logical page number to simplify mapping. Likewise, the physical sector number in flash memory 18 can be set to always be equal to the logical sector number from the LSA.

In this example, each partial logical-to-physical mapping table 20 has 4 entries; each entry has four pages, and each pager has four sectors. Thus each partial logical-to-physical mapping table 20 can map 16 pages into 4 physical blocks (PBA). Each entry in partial logical-to-physical mapping table 20 maps to one PBA.

In a more realistic example, each page is 4K bytes or 8 sectors. Each physical block has 256 pages, so the page # within the block requires 8 bits. A larger number of entries could also be supported in partial logical-to-physical mapping table 20 by using more than 2 bits for the entry #. However, the simplified example shown in FIG. 4 is used for the examples of FIGS. 5-10.

FIG. 5 highlights entries and a page map in a partial logical-to-physical mapping table. Partial logical-to-physical mapping table 20 can store up to four entries E1, E2, E3, E4, shown as rows in FIG. 5. Each entry stores a PBA that the LSA is mapped to when the LSA hits that entry in partial logical-to-physical mapping table 20.

A page map is also stored for each entry. The page map has a valid for each page within the physical block. When the page valid bits is set to 1, the page is resident, and valid data for the page is stored in page data buffer 15 (FIG. 3) in RAM 16, or in flash memory 18. When the page valid bit is 0, the page has no valid data in page data buffer 15 or in flash memory 18.

The set number for the entries in partial logical-to-physical mapping table 20 can also be stored with partial logical-to-physical mapping table 20, or can be stored as a parameter for a firmware routine or in a register. When the LSA from the host has a different set number than the stored set #, a mapping miss occurs, and the entries in partial logical-to-physical mapping table 20 must be copied to N sets of partial logical-to-physical mapping tables 22 in flash memory 18 if the L2P modified flag is set.

When the LSA from the host has a set number that matches the stored set #, a mapping table-hit occurs. The entry # from the LSA is sued to select one of the four entries in partial logical-to-physical mapping table 20. The PBA indicates the physical block that should be used to store the host data. If the entry is not yet valid, a new PBA can be assigned using the wear-leveling counters.

The page# and entry# for host data that was last stored into page data buffer 15 can also be stored. The stored page# can be compared with the page# from the host LSA to determine when page data buffer 15 stores data from the same page, while the stored entry# can be compared with the entry# from the host LSA to determine when page data buffer 15 stores data from the same entry in partial logical-to-physical mapping table 20. The stored page# and stored entry# may be stored as parameters in routines that are executed by a processor rather than in hardware registers.

Figure 6A:
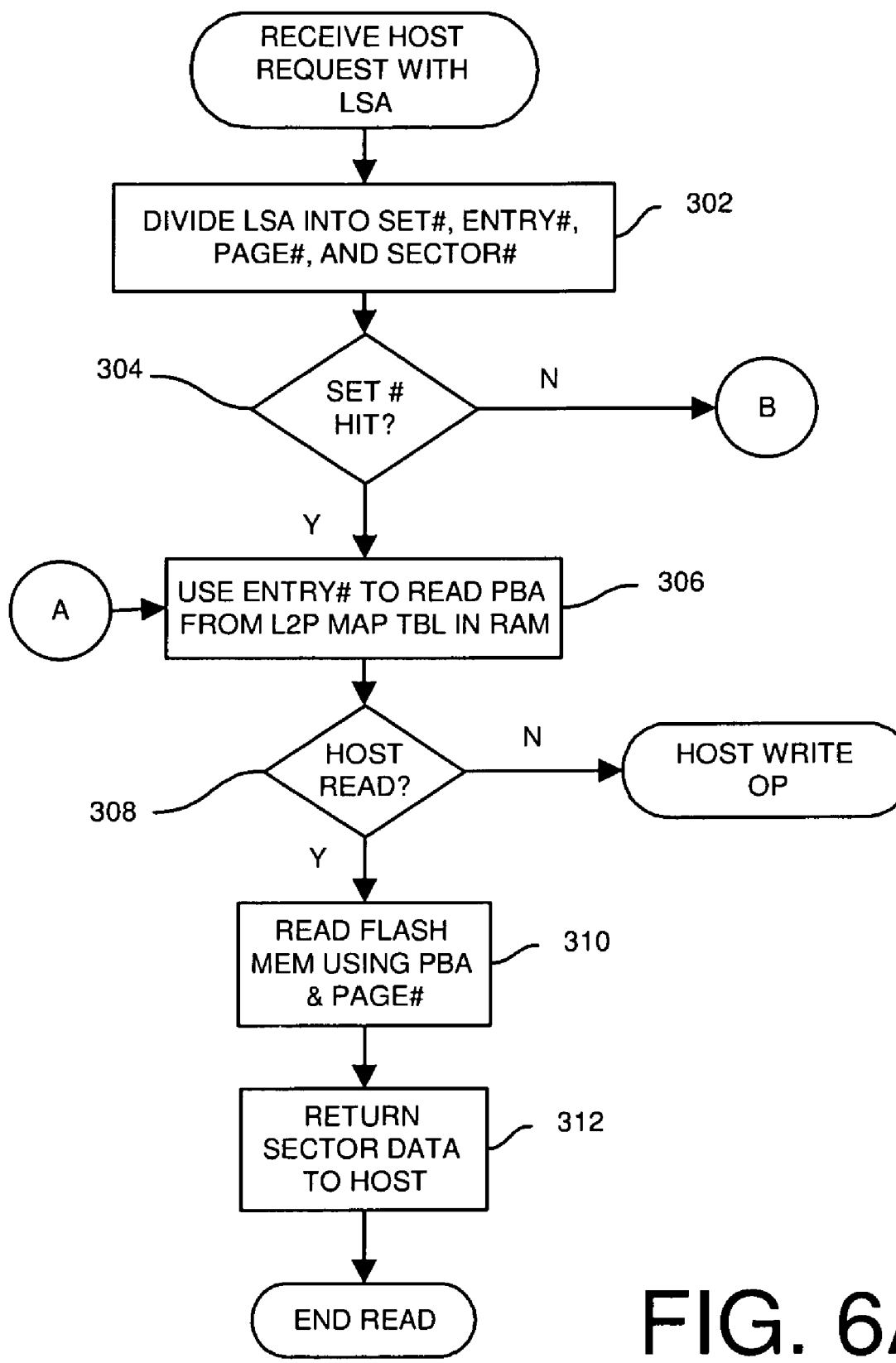
FIGS. 6A-C is a flowchart of the flash controller processing a host request by accessing a partial logical-to-physical mapping table.
Figure 6B:
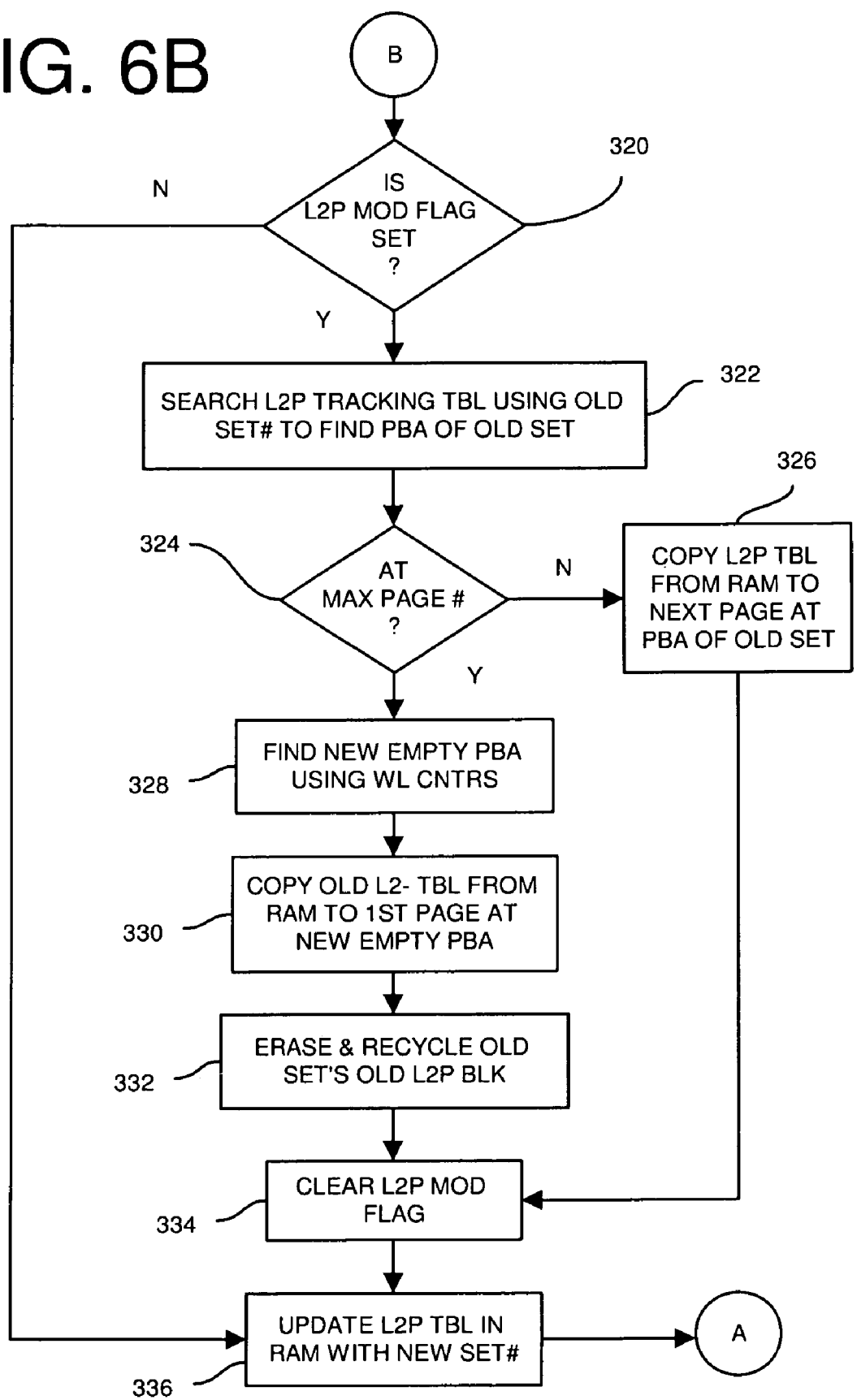
Figure 6C:
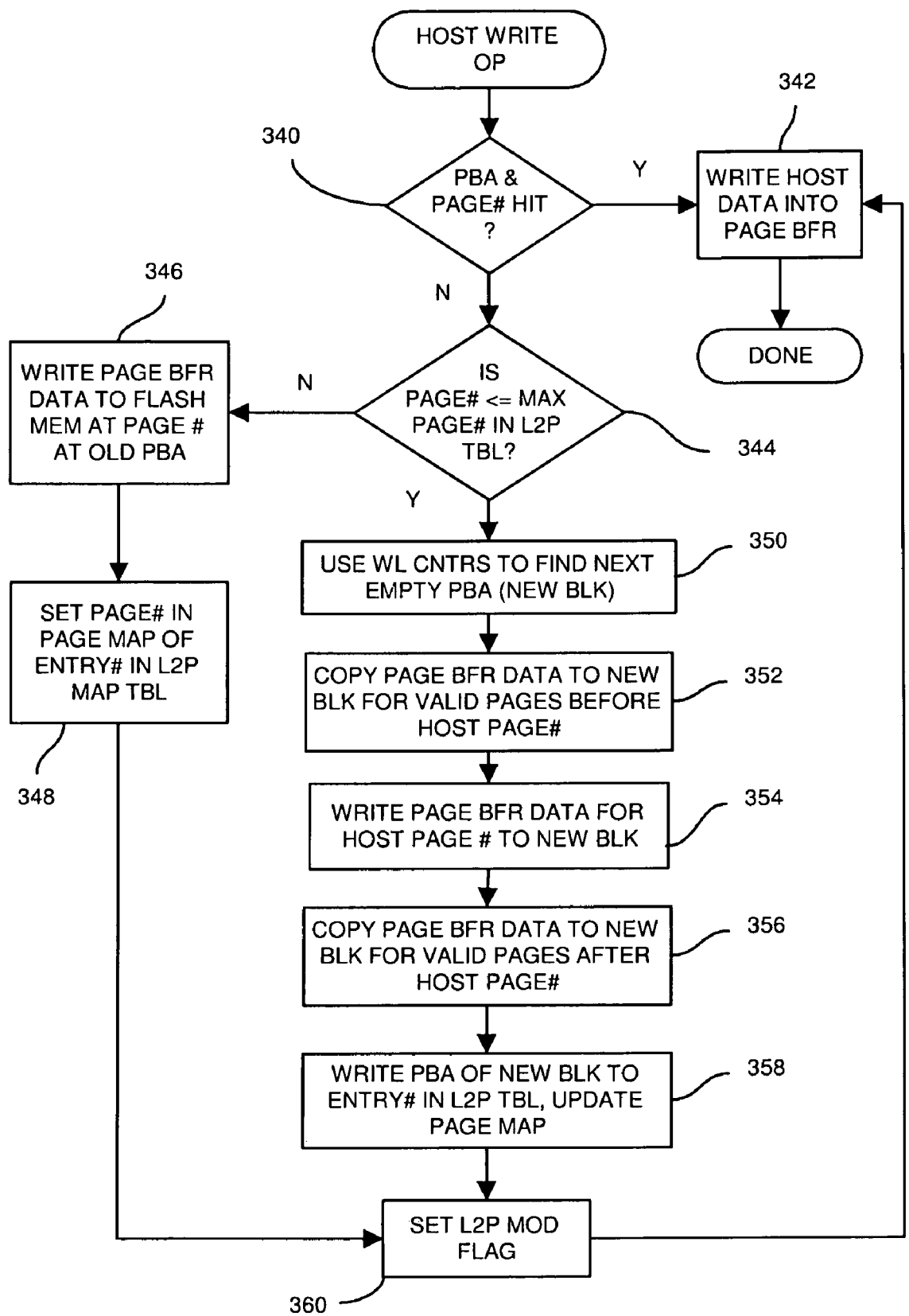

FIGS. 6A-C is a flowchart of the flash controller processing a host request by accessing a partial logical-to-physical mapping table. In FIG. 6A, step 302, the LSA from the host request is divided into address bits for the set #, entry#, page#, and sector#, as shown in FIG. 4. The set# stored for the partial logical-to-physical mapping table is compared to the set# from the host's LSA, and when a set# match occurs, the LSA hits in the partial logical-to-physical mapping table, step 304. Processing of a set# miss is shown in FIG. 6B.

When the set# hits, step 304, the entry# from the host LSA selects one of the entries within partial logical-to-physical mapping table 20 (FIG. 5). The PBA stored in this entry is read, step 306. When the host is writing, step 308, the process continues in FIG. 6C, which shows the host write operation.

For host reads, step 308, the data is read from the flash memory using the PBA read from the partial logical-to-physical mapping table, step 310, along with the page# from the host LSA. If the data was recently written by the host, the data may be read from page data buffer 15 instead of from flash memory 18 (FIG. 3). The sector data is returned to the host, step 310, and the host read finishes. Several sequential sectors may be returned to the host.

In FIG. 6B, the set# missed the partial logical-to-physical mapping table in step 304 of FIG. 6A. The entries currently stored in the partial logical-to-physical mapping table are for a different one of the N sets of partial logical-to-physical mapping tables. These old entries may need to be copied to N sets of partial logical-to-physical mapping tables 22 in flash memory 18 before new entries for the host's set# are copied from N sets of partial logical-to-physical mapping tables 22 in flash memory 18 to partial logical-to-physical mapping table 20 in RAM 16 (FIG. 3).

When the L2P modified flag is not set, step 320, the old entries in the partial logical-to-physical mapping table have not been modified. Thus the old entries do not need to be copied back to flash memory. Instead, one of the N sets of partial logical-to-physical mapping tables 22 in flash memory 18 is read and copied to partial logical-to-physical mapping table 20 in RAM 16. The set# from the host LSA is used to select one of the N sets for copying. For example, the set# could be multiplied by the size of one set of entries and added to a base address for the N sets of partial logical-to-physical mapping tables to obtain an address of the selected set in flash memory. This selected set read from flash memory is written into partial logical-to-physical mapping table 20, step 336. With partial logical-to-physical mapping table 20 loaded with entries for the new set#, the procedure can resume with step 306 of FIG. 6A.

When the L2P modified flag is set, step 320, the old entries in the partial logical-to-physical mapping table have been modified. The old entries must be copied back to flash memory, since the entries in flash memory are stale. The old set# for the old entries in partial logical-to-physical mapping table 20 is looked up in the L2P tracking table to find the PBA of the old set of entries in N sets of partial logical-to-physical mapping tables 22 in flash memory 18, step 322. The L2P tracking table can be part of wear-leveling and bad-block counters 26 in RAM 16, or may be a separate table with the PBA's for each of the N sets of partial logical-to-physical mapping tables 22 in flash memory 18.

When the physical block (identified by a PBA) that stores the old set of entries in flash memory 18 has at least one empty page, step 324, the old entries from partial logical-to-physical mapping table 20 are copied into this next empty page, step 326. The L2P modified flag can then be cleared, step 334, and the new set of entries read from flash memory 18 and loaded into partial logical-to-physical mapping table 20, step 336, before continuing in FIG. 6A.

However, when the physical block (PBA) that stores the old set of entries in flash memory 18 has no more empty pages, step 324, the old PBA is full. There is no space to store more entries. A new empty physical block and its PBA are located using wear-leveling and bad-block counters 26, step 328, and as shown in more detail in FIG. 8. The old entries from partial logical-to-physical mapping table 20 in RAM 16 are copied into the first page in the new empty PBA, step 330. The old physical block that was full and used to store the set's mapping entries can now be erased, step 332, and recycled to the pool of empty blocks that can be selected by the wear-leveling and bad-block counters 26. The L2P modified flag can then be cleared, step 334, and the new set of entries read from flash memory 18 and loaded into partial logical-to-physical mapping table 20, step 336, before continuing in FIG. 6A.

In FIG. 6C, the host is writing to flash memory. When the host's set# hits, the entry# from the LSA selects one entry in partial logical-to-physical mapping table 20, and the page resident bits are read. When the page resident bit in partial logical-to-physical mapping table 20 is set for the same page being written by the host, step 340, and a valid PBA has been assigned for this entry, the host is over-writing data that was recently written. The host data is written into page data buffer 15, step 342, with the sector# from the LSA selecting the sector location within page data buffer 15. If page data buffer 15 contains data for a different page, the old data must be flushed to flash memory 18 first, or moved to a write buffer. The host write is then finished.

When the page# from the LSA does is a different page# than for the data in page data buffer 15, or when a valid PBA is not present for an entry, step 340 then the data in page data buffer 15 needs to be written to flash memory 18. The page# for page data buffer 15 of a prior LSA is compared to the page resident bits for the entry selected by the host's entry# in partial logical-to-physical mapping table 20.

When the page# from the host is larger than any previously stored pages for that entry, step 344, the new page is being written in sequence. The restrictive-write MLC rules are being followed. The old data in page data buffer 15 is copied to flash memory 18 using the PBA for that entry, step 346, and the new page# is set in the page map for the new entry in partial logical-to-physical mapping table 20, step 348. The L2P modified flag is set, step 360, and the new data from the host is written into page data buffer 15, step 342.

When the page# from the host is not larger than any previously stored pages for that entry in partial logical-to-physical mapping table 20, step 344, the new page is being written out-of-sequence. The restrictive-write MLC rules are being broken. The block cannot be written regressively with a page that has a page# smaller than an earlier-written page in that block. Instead, a new block must be used. Wear-leveling and bad-block counters 26 are used to find a new empty physical block and its PBA, step 350.

Data in page data buffer 15 for pages earlier in sequence (having a smaller page#) than the host page# are copied to the corresponding pages in the new physical block, step 352. Then the new host data is written to the new physical block at the host's page# from the LSA, step 354. Finally, data in page data buffer 15 for pages having larger page#'s than the host page# are written to the new physical block at their page#'s, step 356. Thus the pages have been written to the new physical block in order of their page#'s.

The PBA for the new physical block is written to the entry in partial logical-to-physical mapping table 20 selected by the entry# from the host LSA, step 358. Also, the page resident bits are set for all pages that were written for the new physical block in steps 352, 354, 356. The L2P modified flag is set, step 360, and the new data from the host is written into page data buffer 15, step 342.

Other procedures may be added for handling other special cases, such as when the host writes and the set# misses, and partial logical-to-physical mapping table 20 is loaded from N sets of partial logical-to-physical mapping tables 22 before writing.

Figure 7B:
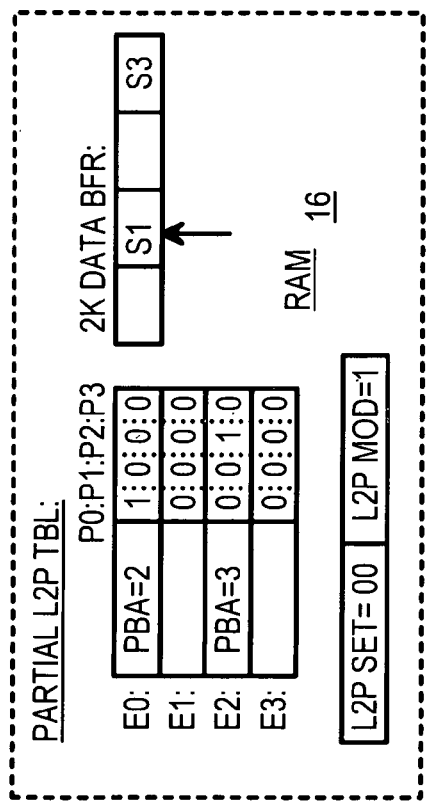
Figure 7B:
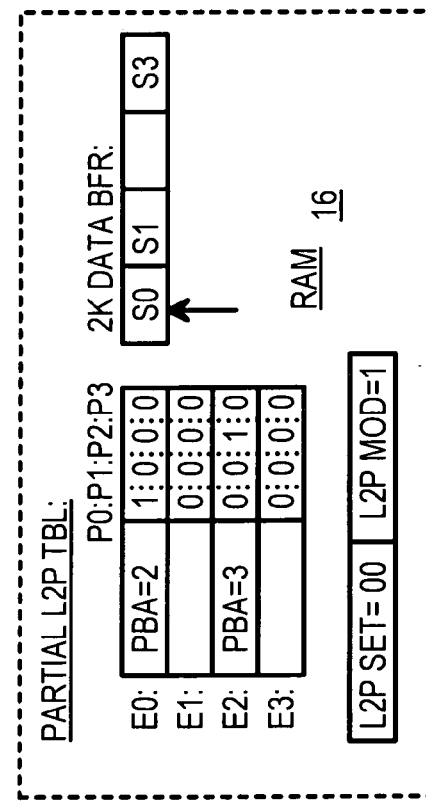

FIGS. 7A-C show examples of host writes to flash memory using the partial logical-to-physical mapping table. In FIG. 7A, the host writes to sector 41. Using the LSA partitioning example of FIG. 4, the sector# is the lowest 2 bits, or 01, the page# is the next 2 bits, or 10, the entry# is the next 2 bits, or 10, and the set# is the upper 2 bits, or 00.

Since the set# from the host LSA, 00, matches the stored set# (L2P SET=00) for all the entries in partial logical-to-physical mapping table 20, a table hit occurs. The host's entry#, 10, selects entry E2. This entry was blank, so a new physical block is assigned by consulting wear-leveling and bad-block counters 26. The PBA for this new physical block is PBA=3, which is written into entry E2. The host page# is 10, so the page-resident bit for page P2 is set in entry E2. The sector data from the host, S41, is written into page data buffer 15 at the host's sector#, 01. The L2P modified flag is then set.

The host then writes sector 3, S3, which has an LSA of 3, which is divided into a set#, entry#, page#, sector# of 00, 00, 00, 11. The set#00 hits, but a different entry E0 is selected in partial logical-to-physical mapping table 20. Since page data buffer 15 can only hold data for one page, the old data for sector 41, S41, is copied to flash memory using PBA=3 for old entry E3. The page resident bits for old entry E3 show that the old data, S41, was for page P2, so page P2 of flash memory is written by sector S41. The LSA for the old entry is written into the spare area in flash.

The host's entry#, 00, selects new entry E0. This entry was blank, so a new physical block is assigned by consulting wear-leveling and bad-block counters 26. The PBA for this new physical block is PBA=2, which is written into entry E0. The host page# is 00, so the page-resident bit for page P0 is set in entry E0. The sector data from the host, S2, is written into page data buffer 15 at the host's sector#, 11. The L2P modified flag is set.

This is an example of a set hit, but a page miss. The old data is written back from page data buffer 15 to flash memory 18 since this old data is for a different page, and page data buffer 15 only holds one page of data.

In FIG. 7B, host writes sector 1, S1, which has an LSA of 1, which is divided into a set#, entry#, page#, sector# of 00, 00, 00, 01. The set#00 hits, and the same entry E0 is selected in partial logical-to-physical mapping table 20. The page#00 (P0) is also the same as data currently stored in page data buffer 15. The new sector data S1 from the host is written into page data buffer 15 at sector#1.

The host next writes sector 0, S0, which has an LSA of 0, which is divided into a set#, entry#, page#, sector# of 00, 00, 00, 00. The set#00 hits, and the same entry E0 is selected. The page#00 (P0) is also the same as data currently stored in page data buffer 15. The new sector data S0 from the host is written into page data buffer 15 at sector#0. Sectors S0, S1, S3 are now stored in page data buffer 15 for page P0.

These are example of a set hit, an entry hit, and a page hit. The new host data is for the same page as existing data in page data buffer 15.

In FIG. 7C, host writes sector 81, S81, which has an LSA of 81, which is divided into a set#, entry#, page#, sector# of 01, 01, 01, 01. The set#01 does not match the stored set# (L2P SET=00) for partial logical-to-physical mapping table 20, so a table miss occurs. The old data in page data buffer 15 must be flushed to flash memory. Also, since the L2P modified flag is set (L2P MOD=1), the entries in partial logical-to-physical mapping table 20 must be flushed to update that set in the N sets of partial logical-to-physical mapping tables 22 in flash memory.

The sector data in page data buffer 15 is for entry E0, so the PBA for entry E0 is read from partial logical-to-physical mapping table 20 and used to locate the physical block in flash memory. The data in page data buffer 15 was for page P0, so page P0 of PBA2 is written with the sector data S0, S1, S3 from page data buffer 15. The LSA for the lowest sector is written into the spare area for this physical block.

Note that the data for entry E2 was previously written to PBA3 in flash memory 18 as shown in FIG. 7A when a page miss occurred. Thus all data has now been flushed to flash memory 18.

The entries E0, E2, in partial logical-to-physical mapping table 20 are copied to the reserved space in flash memory 18, N sets of partial logical-to-physical mapping tables 22. This set may be fetched and re-loaded into RAM 16 as partial logical-to-physical mapping table 20 if a future host access uses the same set#.

Once both the data from page data buffer 15 and the entries in partial logical-to-physical mapping table 20 have been flushed to flash memory 18, entries for the new set# from the host LSA are read from flash memory 18 and loaded into partial logical-to-physical mapping table 20. This new set#, 01, has entry E3 stored in flash memory 18, with a mapping of PBA=8 with pages P1, P2 having valid data. Other entries are blank.

The host's LSA selects new entry# E1, This entry was blank, so a new physical block is assigned by consulting wear-leveling and bad-block counters 26. The PBA for this new physical block is PBA=7, which is written into entry E1. The host page# is 01, so the page-resident bit for page P1 is set in entry E1. The sector data from the host, S81, is written into page data buffer 15 at the host's sector#, 01. The L2P modified flag is then set.

This is an example of a set miss. The new set# is stored, L2P SET=01.

Figure 8A:
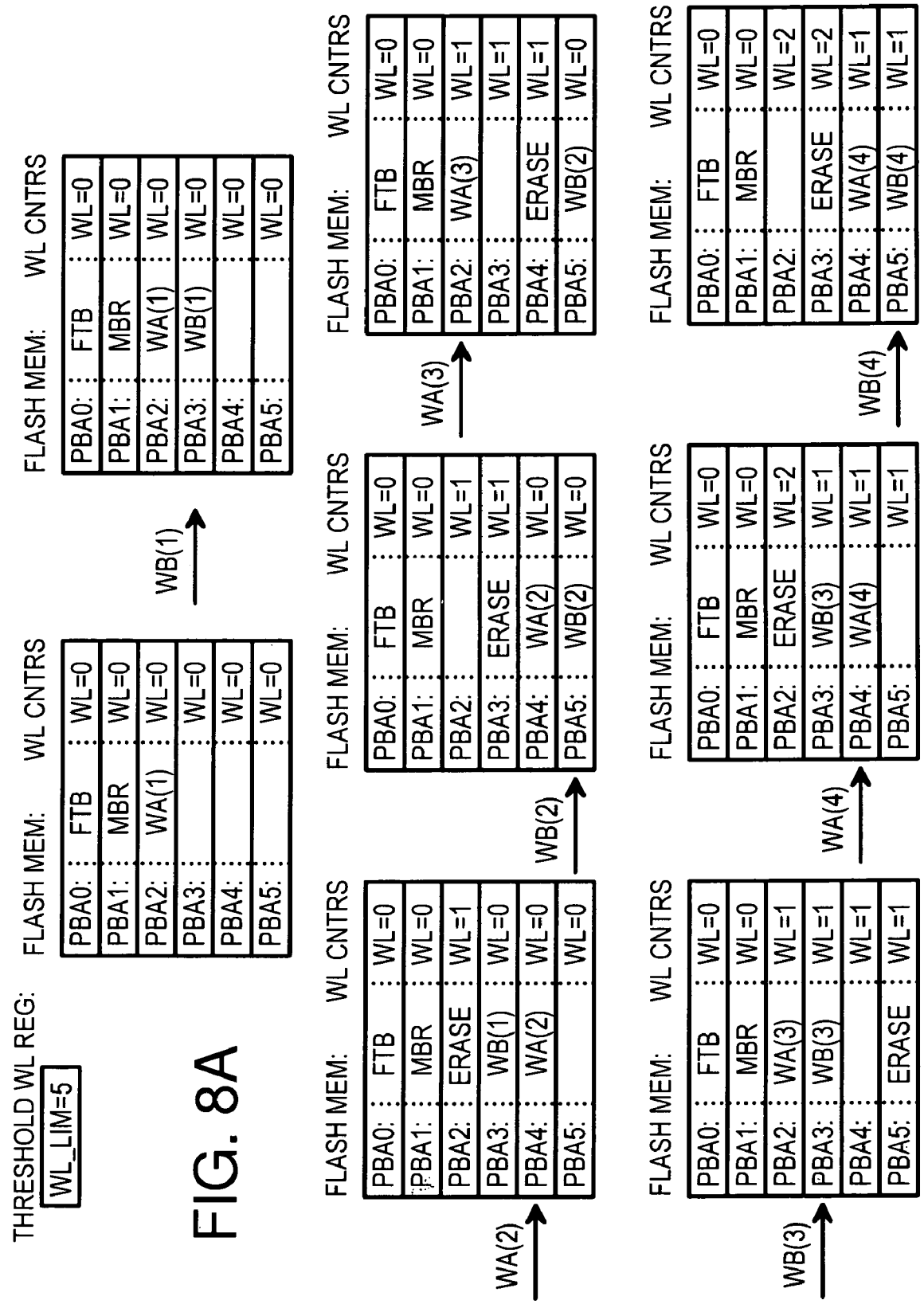
FIGS. 8A-D show examples of wear-leveling when processing host writes.

FIGS. 8A-D show examples of wear-leveling when processing host writes. In FIG. 8A, a threshold for wear-leveling has been set at 5 erases (WL_LIM=5) in wear-leveling and bad-block counters 26. The flash memory has 6 physical blocks PBA0 to PBA5. None of the physical blocks has yet been erased, so the wear-leveling counters for all blocks are initially =0. The first block has been loaded with system-specific timing information and parameters as a Flash Timing Block (FTB), while the second block stores the Master Boot Record (MBR). The host has written WA(1), which is stored in physical block PBA2.

The host then writes different data, WB(1), which is stored in physical block PBA3. When the host writes the A data for a second time, WA(2), the old data WA(1) is erased in block PBA2, while the new data is written to PBA4. The WL counter for PBA2 is incremented to 1 as the block holding old data WA(1) is erased. After erasing PBA2 is empty and available.

WB(2) is loaded into empty PBA5, and the old data WB(1) in PBA3 is erased and its WL counter incremented. WA(3) is loaded into empty block PBA2, while WA(2) is erased and its WL counter incremented. Then WB(3) is loaded into empty block PBA3, while WB(2) is erased and its WL counter incremented. WA(4) is loaded into empty block PBA4, WB(4) is loaded into empty block PBA5, and their WL counters incremented.

Figure 8B:
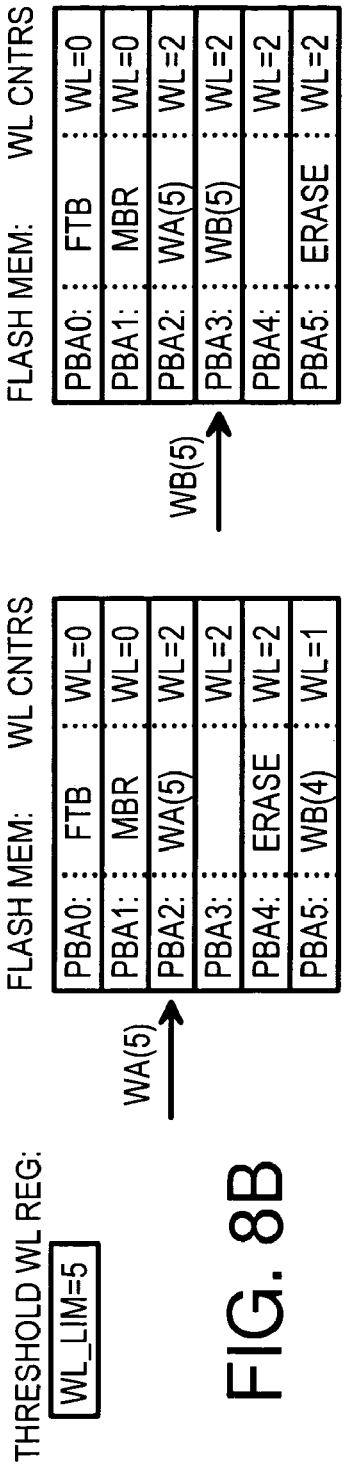
Figure 8B:
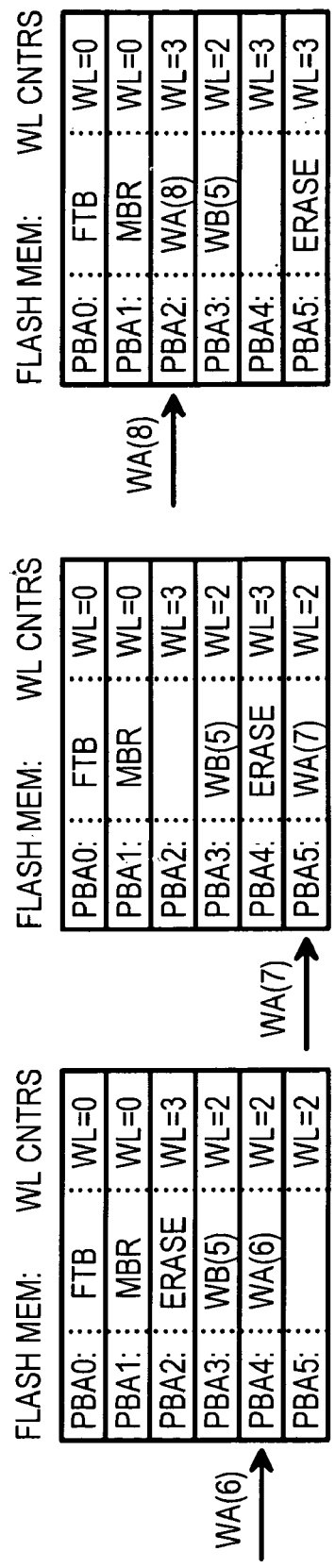
Figure 8B:
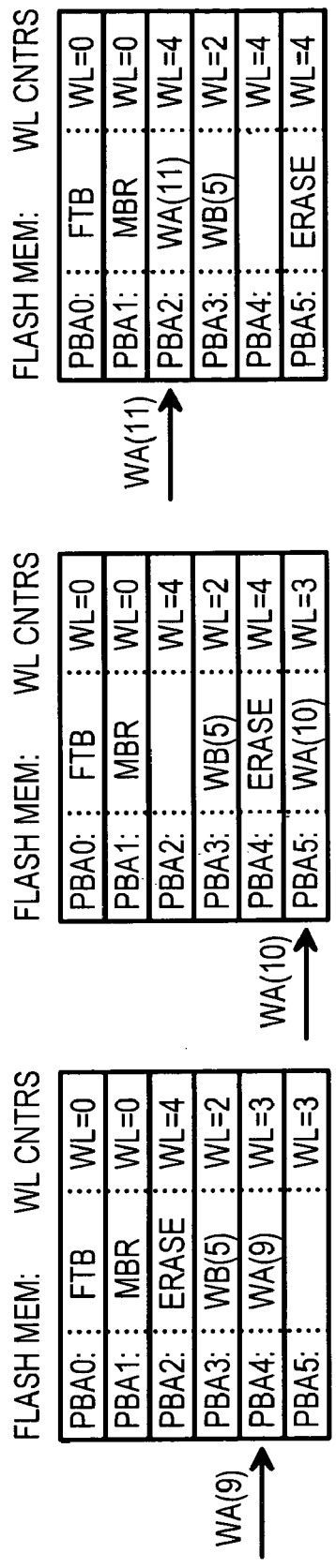

In FIG. 8B, WA(5) is loaded into empty block PBA2, and WB(5) is loaded into empty block PBA3. Then WA(6) is loaded into PBA4, WA(7) is loaded into PBA5, WA(8) is loaded into PBA2, WA(9) is loaded into PBA4, WA(10) is loaded into PBA5, and WA(11) is loaded into PBA2. WL counters are incremented as blocks are erased.

Figure 8C:
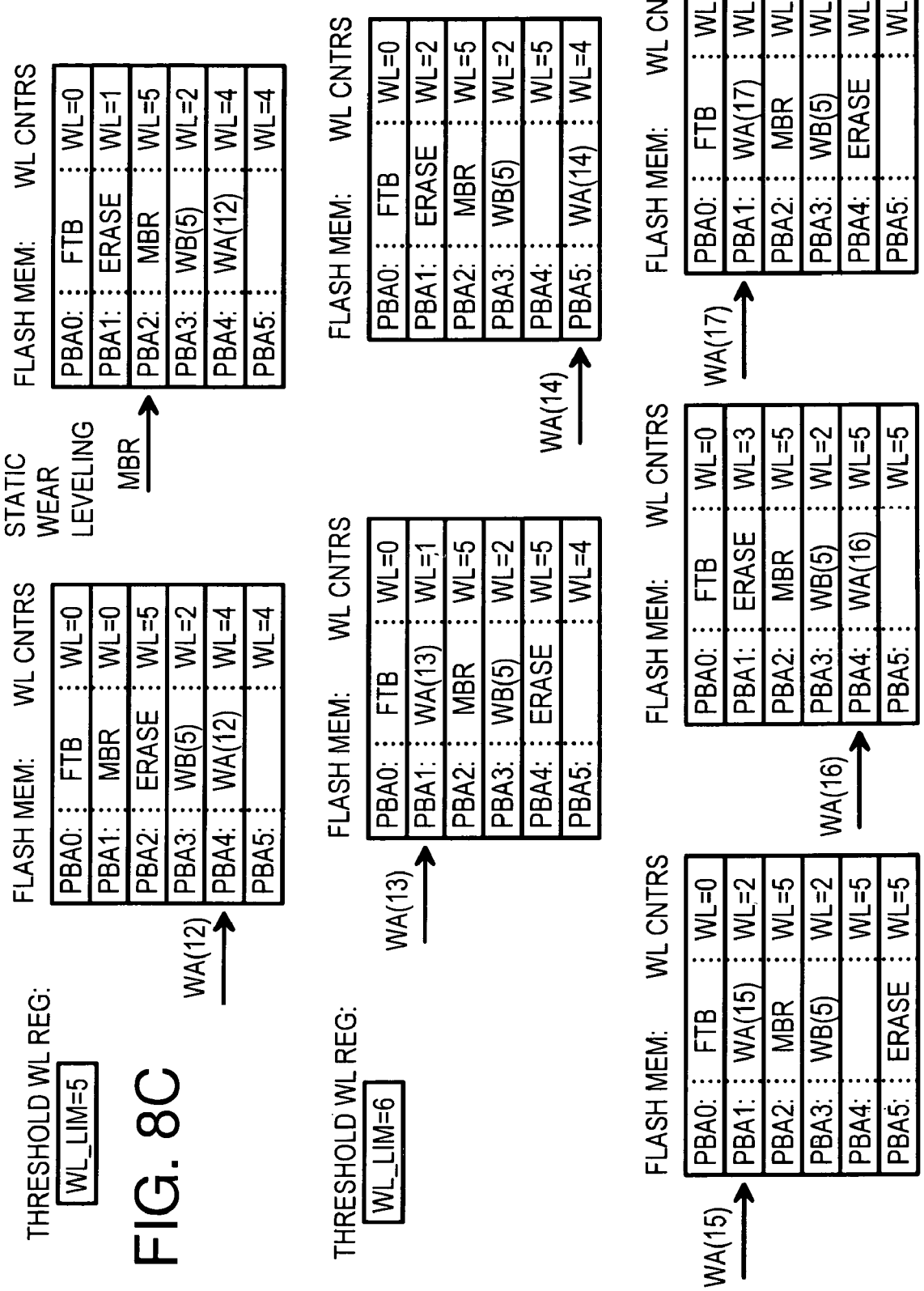

In FIG. 8C, WA(12) is loaded into PBA4, and PBA2 is erased, resulting in a WL counter of 5, which reaches the WL threshold. Static wear-leveling is then performed. The MBR usually does not change and thus no writes or erases have occurred to its physical block. During static wear leveling, MRB is moved from least-worn PBA1 to most-worn PBA2.

The wear-leveling threshold is increased to 6. In a real system, the wear-leveling threshold can be increased by a larger amount, and typically has a larger value. PBA1 is erased and receives WA(13). Then PBA1 is erased as WA(14) is written to PBA5. WA(15) is written to least-worn PBA1, then WA(16) is written to PBA4 and WA(17) is written to PBA1.

Performing static wear-leveling frees up a least-worn physical block being used by the MBR to be used more frequently by rapidly-changing data. Thus overall wear is evened out.

Figure 8D:
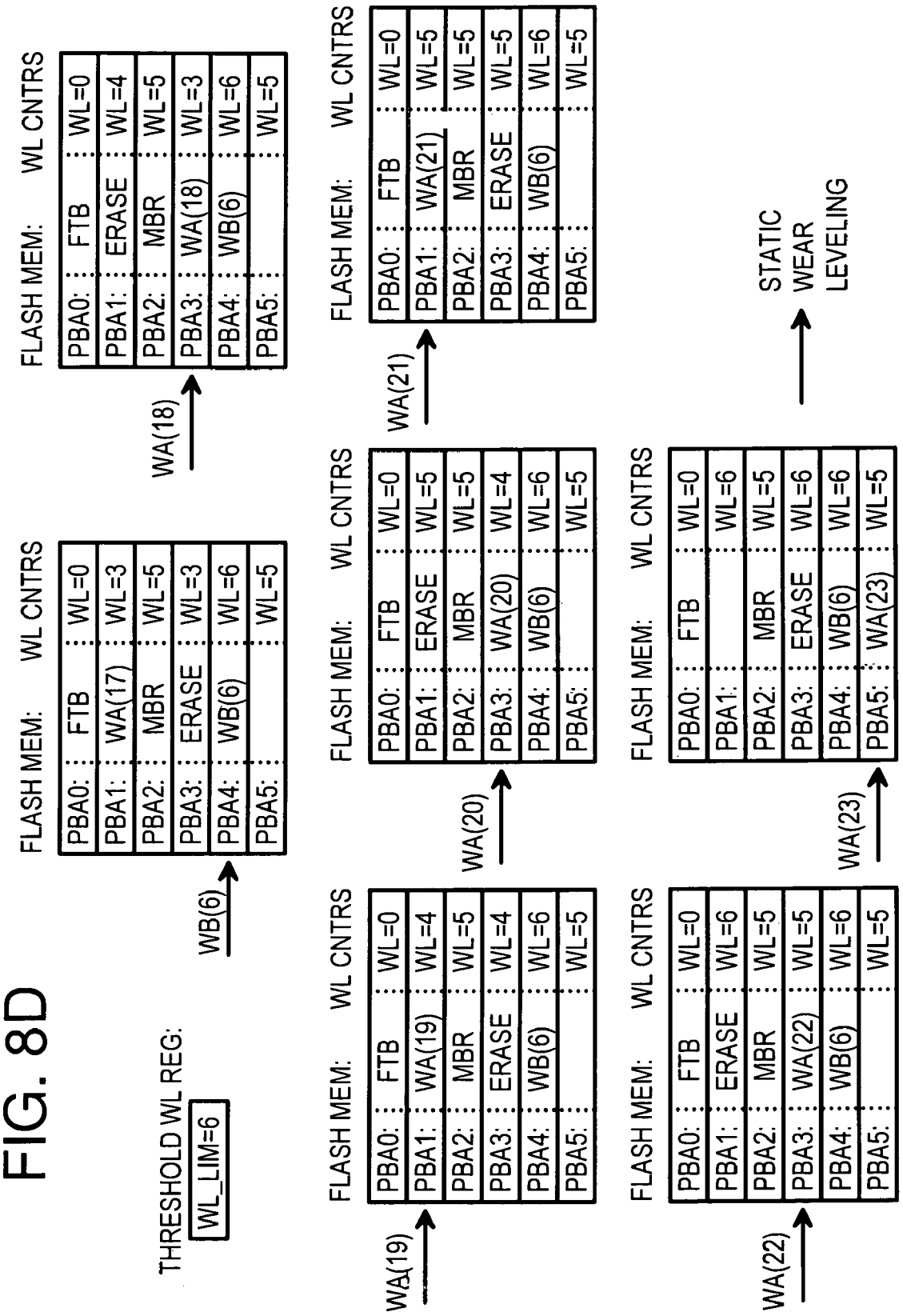

In FIG. 8D, WB(6) is written to PBA4, and PBA3 is erased and used for WA(18). WA(19) is written to PBA1, WA(20) is written to PBA3, WA(21) is written to PBA1, WA(22) is written to PBA3, and WA(23) is written to PBA5 before the wear-leveling threshold is reached again and needs to be increased. Thus static wear leveling can dramatically increase the number of blocks that can be written to flash memory by relocating a static block such as the MBR.

Figure 9A:
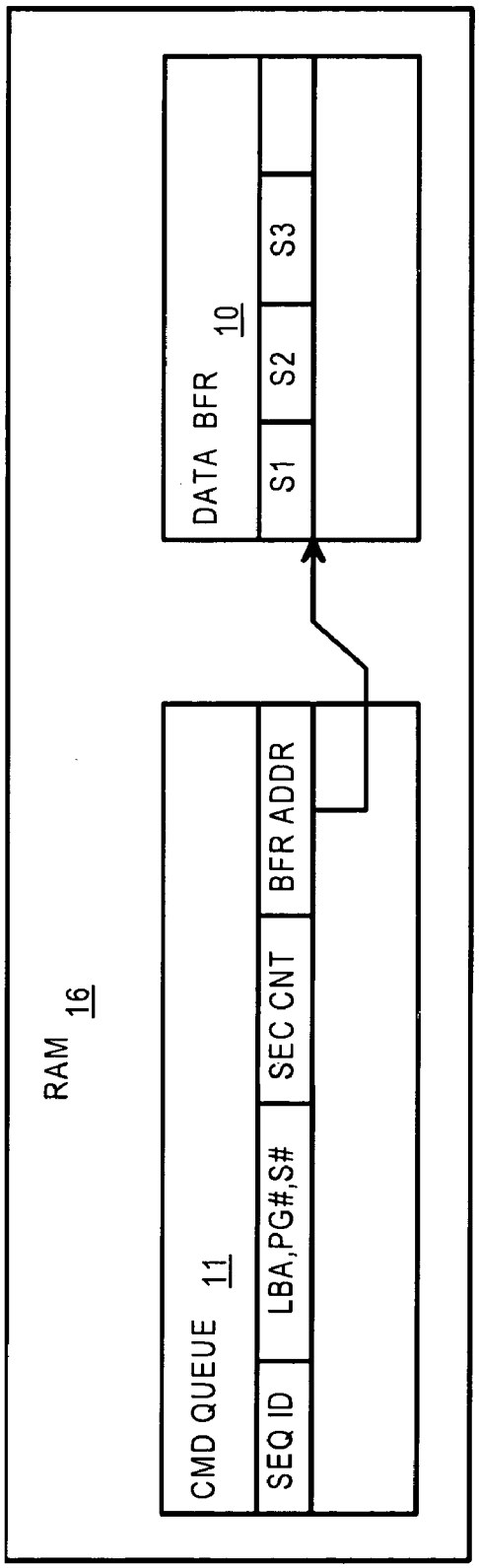
FIG. 9A shows a command queue in a flash controller.

FIG. 9A shows a command queue in a flash controller. RAM 16 in the flash controller has data buffer 10 that stores multiple sectors of sector data S1, S2, S3 from the host. RAM 16 also includes command queue 11 which stores command information from the host, such as the SEQ ID, LSA, Sector Count, and Starting Buffer Address.

Each entry (row in FIG. 9A) in command queue 11 is identified by a sequence ID (SID) that can be explicitly stored, or can be implicit, such as the location of the row within the queue. Each entry stores the LSA from the host, including the LBA (set# and entry# in partial logical-to-physical mapping table 20), page#, and sector#. The sector count (SC) is the number of sectors of data. These sectors are sequential, since the host only transfers sectors in sequence order without gaps for any one host command.

The buffer address stored in an entry is a pointer to the sector data in data buffer 10. Thus the buffer address links the command information stored in command queue 11 with the host data stored in data buffer 10. Other fields may be stored in entries in command queue 11, and other formats or encodings may be used, such as storing an ending address rather than the sector count.

Figure 9B:
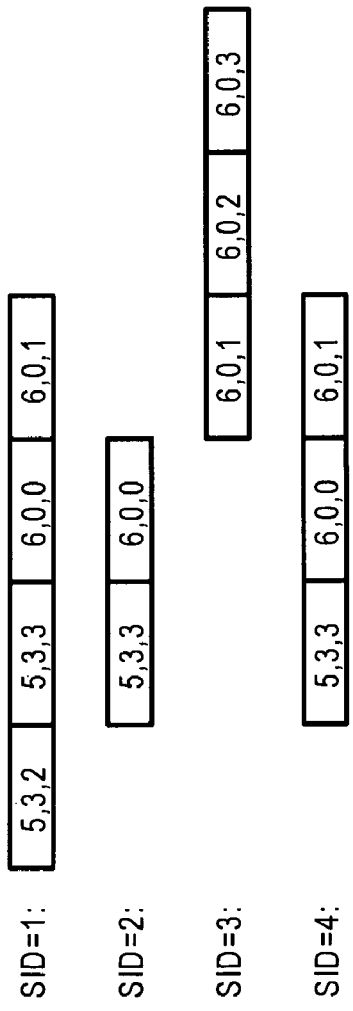
FIG. 9B shows data relationships for a series of host write commands.

FIG. 9B shows data relationships for a series of host write commands. The first host command is loaded into an entry in command queue 11 with a sequence ID of 1 (SID=1), and has 4 sectors of data. The first sector has the host's LSA of 5, 3, 2, indicating LBA=5, page#=3, sector#=2. The next 3 sectors received from the host during this command have LSA's of 5, 3, 3, then 6, 0, 0, and 6, 0, 1. In this example, each page has 4 sectors and each LBA has 4 pages, so 5, 3, 3 is the last sector in the last page of logical block 5, and 6, 0, 0 is the first sector in the first page of logical block 6.

The second host write command (SID=2) writes 2 sectors, 5, 3, 3, and 6, 0, 0. Since these 2 sectors were just written by the prior host-write command SID=1, this second command is fully overlapped by the first write command. The data for sectors 5, 3, 3 and 6, 0, 0 from write SID=1 is discarded and over-written by the new data for command SID=2.

The third host write, SID=3, is partially overlapping with the first write command. The first sector 6, 0, 1 overlaps, but the next 2 sectors 6, 0, 2 and 6, 0, 3 are non-overlapping.

The fourth host write, SID=4, is fully overlaps other write commands. The first 2 sectors 5, 3, 3, and 6, 0, 0 of data from SID=4 over-write the old data from second command SID=2, while the last sector 6, 0, 1 from SID=4 over-writes the old data from second command SID=3. When command queue 11 is used, writes to flash memory 18 can be deleted for old data that is quickly over-written by new host data. This reduces wear of flash blocks and reduces the bandwidth of the flash interface that is consumed.

FIGS. 10A-H are examples of combining host commands using a command queue. The host commands shown in FIG. 9B are used in the examples of FIG. 10A-H.

In FIG. 10A, command queue 11 is initially empty. The read pointer has caught up with the write pointer. A first write command from the host is written into command queue 11 at the location pointed to by the write pointer, and assigned a sequence ID of SID=1. FIG. 9B shows that this write has a LSA of 5, 3, 2, and has 4 sectors of data, so sector count SC is 4 for this entry in command queue 11. The last sector in this write has a LSA of 6, 0, 1 (see SID=1 in FIG. 9B), so 6, 0, 1 is written as the ending LSA (LBA, page#, sector#) for this entry in command queue 11.

The four sectors of data are stored in data buffer 10 starting at buffer address 0 and ending at buffer address 3. These starting and ending buffer addresses are also stored with this entry in command queue 11 so the host's data can be located.

In FIG. 10B, the second host write command is stored in the second entry in command queue 11 as SID=2. The LSA from the host is 5, 3, 3, with a sector count of 2, and an ending LSA of 6, 0, 0. FIG. 9B shows that two sectors 5, 3, 3 and 6, 0, 0 are written by the host in command SID=2. This host data may be temporarily stored, such as in a FIFO or other buffer, before being written into data buffer 10. Since the buffer has not yet been written, the starting and ending buffer address are not yet known and shown as "X" for entry SID=2.

In FIG. 10C, processor 232 (FIG. 1) or another processor or logic examines the two entries in command queue 11 and discovers that an overlap exists. Since the 2 new sectors for SID=2 fully overlap with the old data for SID=1, the new sector data can over-write the old sector data in data buffer 10. A new entry in data buffer 10 is not needed. Since the data from SID=2 has been fully merged into the data for SID=1, the entry in command queue 11 for SID=2 is no longer needed and is deleted. The write pointer remains pointing to this location in command queue 11 to receive the next host command.

In FIG. 10D, the next host command is assigned SID=3, but loaded into the second location in command queue 11 that was earlier occupied by SID=2 in FIG. 10B. This third host command has an LSA of 6, 0, 1, and a sector count of 3, ending at LSA=6, 0, 3. Since there is a partial overlap, the data is not yet loaded into data buffer 10, and the buffer address is still unknown (X).

In FIG. 10E, the overlapping sector of data, 6, 0, 1, over-writes the corresponding data in data buffer 10 at buffer address 3. This overlapping sector is then removed from the write command for SID=3 by modifying its entry in command queue 11. The starting address is moved over by one sector from 6, 0, 1 to 6, 0, 2, so the starting address field in entry SID=3 is changed from 6, 0, 1 to 6, 0, 2. The sector count is reduced by the 1 sector that was merged with the prior write command, so the sector-count field in SID=3 is reduced from 3 to 2. These 2 non-overlapping sectors of data are then written into data buffer 10 at the next available locations, buffer addresses 4 and 5. The starting buffer address field is set to 4, and the ending buffer address field is set to 5 for SID=3.

In FIG. 10F, the write pointer advances to the next location in command queue 11, and the next command is loaded there as SID=4. This fourth host-write command writes 4 sectors starting at 5, 3, 3 and ending at 6, 0, 1. The data is not yet written to data buffer 10 pending resolution of the overlap, so the buffer addresses are X.

Since SID=4 is fully overlapped by SID=1, the new sector data from SID=4 can over-write the old sector data for SID=1 in data buffer 10. The buffer addresses are read from entry SID=1 command queue 11 to determine where to write in the new sector data, at buffer addresses 1, 2, 3 since SID=1 starts at buffer address 0 with 5, 3, 2, which is not an overlapping sector. Since all 3 sectors from new command SID=4 are merged into old command SID=1, the entry for SID=4 can be deleted. The write pointer remains at this location in command queue 11 as shown in FIG. 10G.

In FIG. 10G, the command-queue processing routine may further detect that the data for SID=1 and SID=3 are adjacent and could be combined into one longer entry. The first entry, SID=1, stores data for sectors 5, 3, 2 to 6, 0, 1, while the second entry, SID=3, stores data for sectors 6, 0, 2 to 6, 0, 3. Since 6, 0, 2 immediately follows 6, 0, 1, the two entries could be merged.

In FIG. 10H, the sector count for entry SID=1 is increased from 4 to 6 to account for the 2 additional sectors for entry SID=3. The ending LSA address is changed from 6, 0, 1 to 6, 0, 3, which was the ending address for SID=3. Now entry SID=1 points to 6 sectors of data. The ending buffer address in SID=1 is changed from 3 to 5, so that the sector data at buffer addresses 4, 5 for SID=3 are not pointed to by SID=1.

Since SID=1 now points to al data from SID=3, the entry for SID=3 can be deleted from command queue 11. The write pointer can be moved backwards, or can remain pointing to the third location if the read pointer can detect empty locations.

By combining overlapping and sequential commands, command queue 11 can reduce the number of writes to flash memory. Wear can also be reduced, since stale data is not written to flash memory unnecessarily. Performance is enhanced.

Figure 11A:
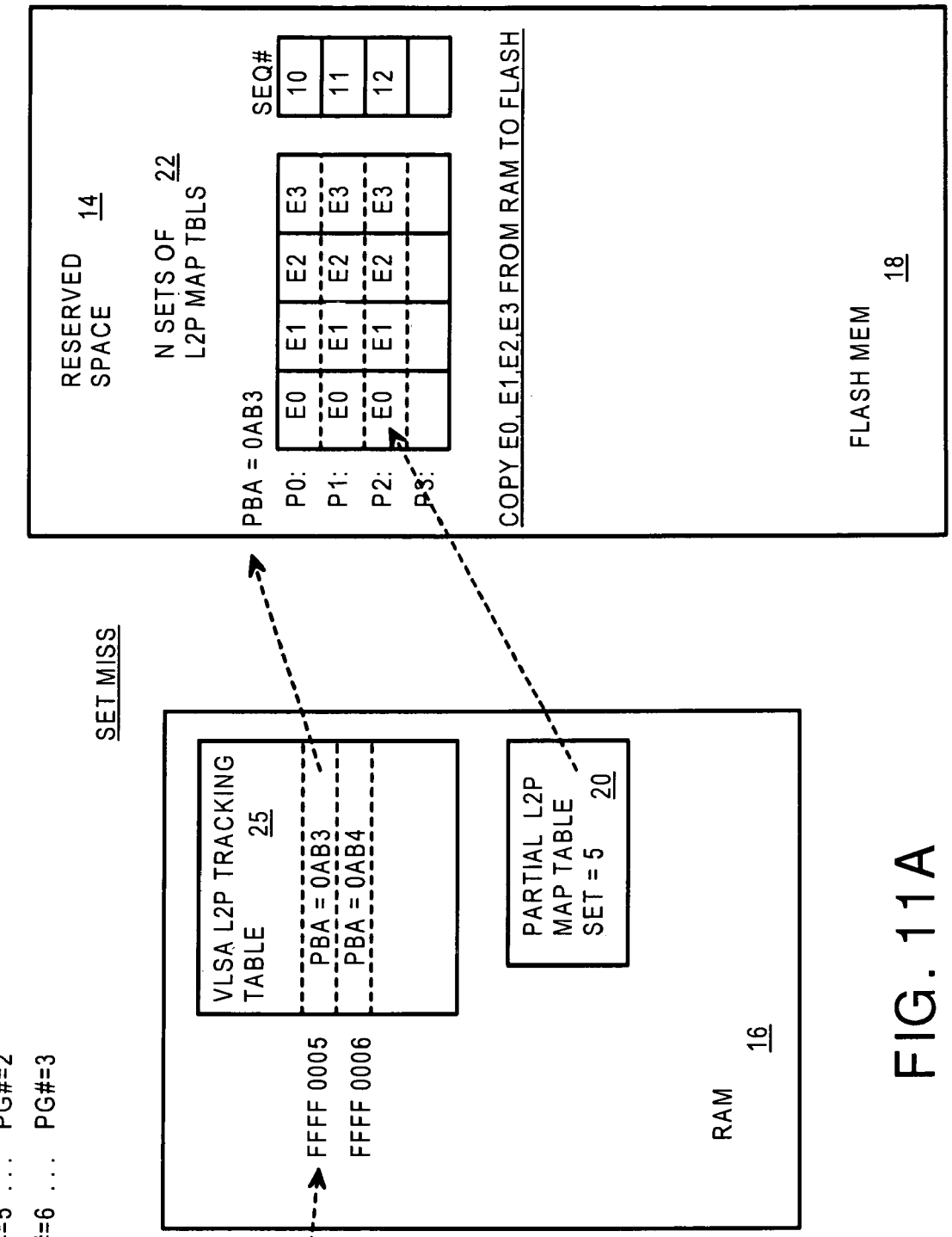
FIGS. 11A-B show usage of the L2P tracking table.
Figure 11B:
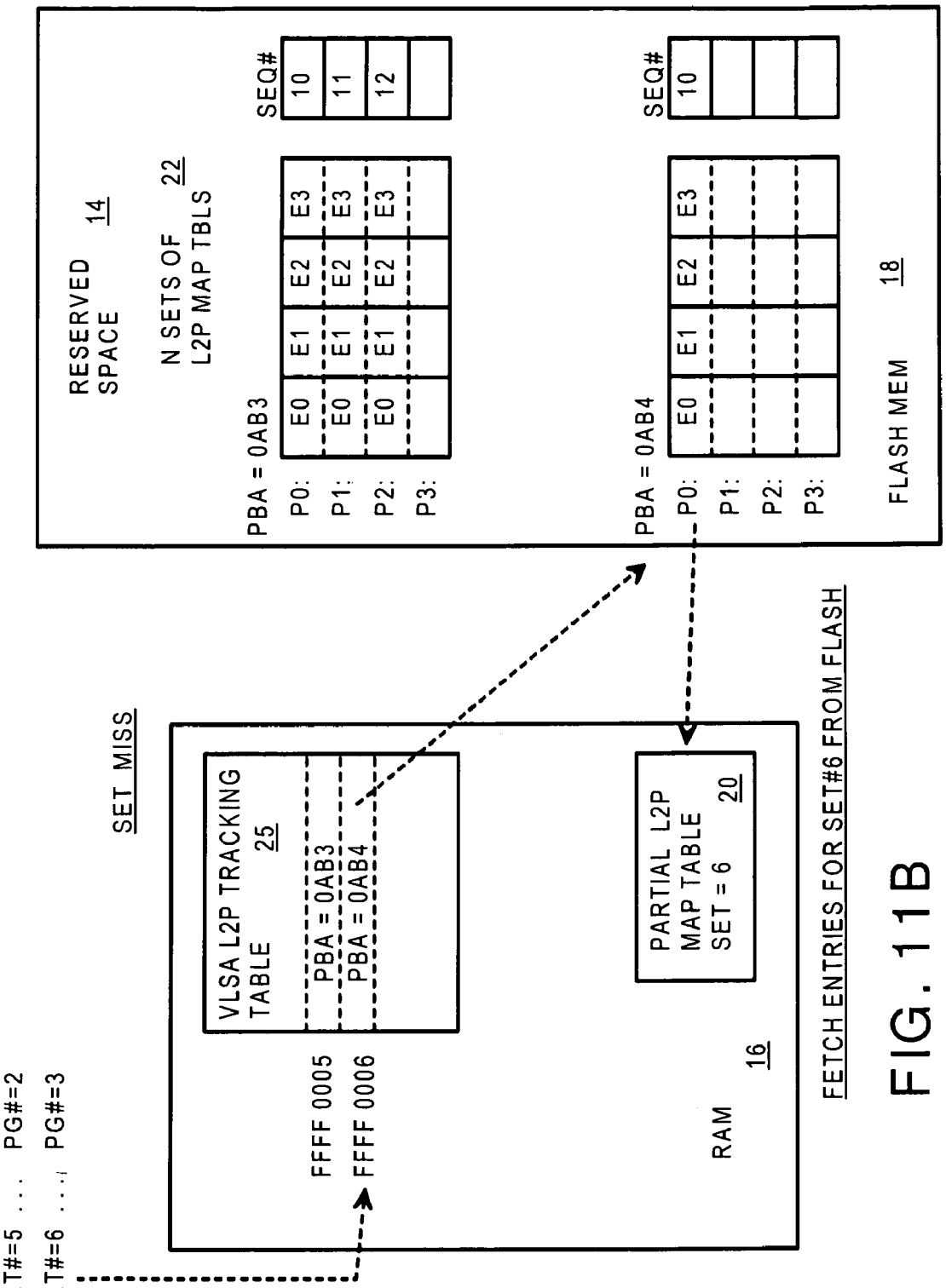

FIGS. 11A-B show usage of the L2P tracking table. In FIG. 11A, partial logical-to-physical mapping table 20 is initially loaded with set#5 by LSA1 from the host. Then a set miss occurs in FIG. 11A.

The host writes to LSA2, which is to a different set# (6) than the old set# (5) for partial logical-to-physical mapping table 20. Thus a mapping table set miss occurs. The entries in partial logical-to-physical mapping table 20 for old set#5 are copied to the next empty page in flash memory 18 at PBA=0AB3, which is found by looking up old set#5 in L2P tracking table 25. The address within N sets of partial logical-to-physical mapping tables 22 is found using the PBA from L2P tracking table 25.

In FIG. 11B, the new set# (6) from LSA2 is looked up in L2P tracking table 25 to find the PBA that stores entries for set #6, PBA=0AB4. Flash memory is read at PBA=0AB4 to locate these mapping entries, which are copied to partial logical-to-physical mapping table 20 in RAM 16. The host can complete its write using the new mapping entries in partial logical-to-physical mapping table 20.

ALTERNATE EMBODIMENTS

Several other embodiments are contemplated by the inventors. For example page data buffer 15 may be somewhat larger that exactly one page, such as to store 2 pages rather than 1 page. However, page data buffer 15 is much smaller than a flash block of data. Processor 232 may be an 8051 processor, a proprietary processor, or a more expensive processor core such as an Advanced RISC Machine ARM-9 CPU core. More than one processor may be used. Data buffer 10 may be a portion of RAM cache 250, or SRAM or SDRAM. Page data buffer 15 may also be part of RAM cache 250, or may be a separate memory or buffer.

The procedures, controllers, and functions can be implemented in a variety of ways. Functions can be programmed and executed by a CPU or other processor, or can be implemented in dedicated hardware, firmware, or in some combination. Many partitionings of the functions can be substituted.

Rather than store page-resident bits, other encodings could be used, or old page numbers could be stored. The page number and entry number for host data currently stored in page data buffer 10 could be explicitly stored in a register, or could be stored by firmware or other routines as parameters or other temporary values.

Different numbers and arrangements of flash storage blocks can connect to the flash interface. Although ECC has been described, checksums or other error detection with or without correction could be substituted. ECC could also be deleted in some embodiments.

Overall system reliability may be improved by having routines that can initiate a "Fault Recovery" or "Auto-Rebuild" process to insert a new single-chip flash-memory device, and to recover or to rebuild the "Lost" or "Damaged" data. The overall system fault tolerance is significantly improved.

Wider or narrower data buses and flash-memory chips could be substituted, such as with 16 or 32-bit data channels. Alternate bus architectures with nested or segmented buses could be used internal or external to the controller. Two or more internal buses can be used to increase throughput. More complex switch fabrics can be substituted for the internal or external bus.

Data striping can be done in a variety of ways, as can parity and error-correction code (ECC). Host command re-ordering can be adjusted depending on the data arrangement used to prevent re-ordering for overlapping memory locations. The flash controller can be integrated with other components such as the flash memory or SDRAM or can be a stand-alone chip.

Additional pipeline or temporary buffers and FIFO's could be added. For example, a host FIFO may be separate, or may be part of RAM cache 250 (FIG. 1). Separate page buffers could be provided for each channel. A single package, a single chip, or a multi-chip package may contain one or more of a plurality of channels of flash memory and/or flash interfaces.

Other size aggregation or partition schemes may be used for different access of flash memory. Flash memory, a phase-change memory, or ferroelectric random-access memory (FRAM), Magnetoresistive RAM (MRAM), Memristor, PRAM, SONOS, Resistive RAM (RRAM), Racetrack memory, and nano RAM (NRAM) may be used.

The host can be a PC motherboard or other PC platform, a mobile communication device, a personal digital assistant (PDA), a digital camera, a combination device, or other device. In some embodiments, rather than using an EUSB host interface, the host bus or host-device interface can be SATA, PCIE, SD, USB, or other host bus.

The flash controller of FIG. 1 may be packaged in TSOP, BGA, LGA, COB, PIP, SIP, CSP, POP, or Multi-Chip-Package (MCP) packages and may include flash memory 240 or RAM cache 250 in separate chips or integrated. The internal bus may be fully or partially shared or may be separate buses or segmented. The flash system may use a circuit board with other components such as LED indicators, capacitors, resistors, etc.

Directional terms such as upper, lower, up, down, top, bottom, etc. are relative and changeable as the system or data is rotated, flipped over, etc. These terms are useful for describing the device but are not intended to be absolutes.

While the host's LSA has been described as having a set#, entry#, page#, sector#, in that order, other orders or divisions of the LSA could be substituted. For example, the entry# could use the MSB's and use higher-significant bits than the set#. Additional bits could be used as tag bits, interleave bits, a channel#, or in some other way. The number N of sets may be 256, 128, 64, or some other value, and the compression achieved is 1/N, or a savings of N−1 sets of storage space in RAM. The wear-leveling and bad-block counters could have a value that indicates a bad block, such as a large erase count value of FFFF.

A flash system may have a packaged flash controller and flash memory die in a single chip package or in separate packages that can be integrated either onto a PCBA, or directly onto the motherboard to further simplify the assembly, lower the manufacturing cost and reduce the overall thickness. Flash chips could also be used with other embodiments including the open frame cards.

Additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A partially-mapped flash-memory controller comprising:
a host interface coupled to a host and configured for receiving host commands and a host logical-sector address (LSA) for host data to be written to flash memory;
a flash interface to a flash memory;
an internal bus coupled to the flash interface;
a host buffer, coupled to the internal bus, configured for buffering data to and from the host interface;
a random-access memory (RAM) coupled to the internal bus;
a processor configured for executing controller routines, the processor coupled to the internal bus;
a page data buffer in the RAM, configured for storing a page of host data;
a command queue in the RAM, configured for storing a plurality of queue entries, each queue entry configured for storing the host command and the host LSA;
a partial logical-to-physical (L2P) mapping table in the RAM, the partial L2P mapping table having entries that each store a physical-block address (PBA) of a physical block in the flash memory;
N sets of partial L2P mapping tables stored in the flash memory;
wherein the partial L2P mapping table stores one set of entries identified by a stored set number, wherein the flash memory requires N sets of entries to map the flash memory, wherein N is a whole number of at least 64;
wherein the host LSA has a set number, an entry number, a page number, and a sector number;
wherein a selected entry in the partial L2P mapping table is usable for mapping to the physical block in the flash memory when the set number matches the stored set number, and the entry number selects the selected entry;
a tracking table in the RAM, the tracking table receiving the set number and outputting a table PBA that locates one of the N sets of partial L2P mapping tables stored in the flash memory;
wear-leveling counters that each indicate a number of erases of a different physical block in the flash memory;
wherein the entries in the partial L2P mapping table each further comprise a plurality of page-resident bits, each page-resident bit identifying when a bit's page identified by a bit's page number from a bit's host LSA has been written to the flash memory;
a table miss routine, executed by the processor when the stored set number mis-matches the set number from the host LSA, configured for copying modified entries in the partial L2P mapping table to the flash memory, and configured for reading a new set from flash memory, the new set being one of the N sets of partial L2P mapping tables in flash memory, and configured for loading the new set to the partial L2P mapping table;
wherein a first stored page number identifies a first page number of a first host LSA of data currently stored in the data buffer;
wherein a first stored entry number identifies a first entry number of the first host LSA of data currently stored in the data buffer;
a buffer miss routine, executed by the processor when the first stored page number mis-matches the page number from the host LSA, or when the first stored entry number mis-matches the entry number from the host LSA, the buffer miss routine moving data stored in the data buffer to an old physical block in the flash memory, the old physical block being identified by an old PBA read from an old entry in the partial L2P mapping table, the old entry being located by the first stored entry number,
whereby the RAM stores one of N sets of mapping entries to partially map the flash memory and whereby page-resident bits are set in entries in the partial L2P mapping table.

2. The partially-mapped flash-memory controller of claim 1 further comprising:

an out-of-order check routine, executed by the processor, for examining the page-resident bits in the old entry in the partial L2P mapping table to determine when the page number from the host LSA is not a maximum of page numbers corresponding to the page-resident bits set for the old entry, and signaling an out-of-page-order flush when page number from the host LSA is not the maximum of page numbers; and an out-of-order flush routine, activated when the out-of-page-order flush is signaled, comprising:

location means for locating an empty physical block in the flash memory using wear-leveling counters that indicate a number of erasures of a physical block;

first read means for reading an old PBA from the old entry and using the old PBA to read old pages from an old physical block in the flash memory;

first write means for writing in page-number-order the old pages to the empty physical block for pages having a page number that is lower than the stored page number;

second write means for writing data stored in the data buffer to the empty physical block after old pages having the page number that is lower than the stored page number have been written to the empty physical block;

third write means for writing in page-number-order the old pages to the empty physical block for pages having a page number that is greater than the stored page number after the data from the data buffer has been written to the empty physical block;

fourth write means for writing a new PBA that identifies the empty physical block to the old entry in the partial L2P mapping table; and erase means for erasing the old physical block in the flash memory after the old pages have been read, whereby old pages are re-ordered with the data stored in the data buffer when the out-of-page-order flush is signaled.

3. A partially-mapped flash-memory controller comprising:

a host interface coupled to a host and configured for receiving host commands and a host logical-sector address (LSA) for host data to be written to flash memory;

a flash interface to a flash memory;

an internal bus coupled to the flash interface;

a host buffer, coupled to the internal bus, configured for buffering data to and from the host interface;

a random-access memory (RAM) coupled to the internal bus;

a processor configured for executing controller routines, the processor coupled to the internal bus;

a page data buffer in the RAM, configured for storing a page of host data;

a command queue in the RAM, configured for storing a plurality of queue entries, each queue entry configured for storing the host command and the host LSA;

a partial logical-to-physical (L2P) mapping table in the RAM, the partial L2P mapping table having entries that each store a physical-block address (PBA) of a physical block in the flash memory;

N sets of partial L2P mapping tables stored in the flash memory;

wherein the partial L2P mapping table stores one set of entries identified by a stored set number, wherein the flash memory requires N sets of entries to map the flash memory, wherein N is a whole number of at least 64;

wherein the host LSA has a set number, an entry number, a page number, and a sector number;

wherein a selected entry in the partial L2P mapping table is usable for mapping to the physical block in the flash memory when the set number matches the stored set number, and the entry number selects the selected entry;

whereby the RAM stores one of N sets of mapping entries to partially map the flash memory;

wherein the host interface further comprises:

a physical layer that de-serializes data from the host received over a receive differential pair of lines, and that serializes data for transmission to the host over a transmit differential pair of lines, the physical layer adding a frame start and a frame end;

a transport layer that adds a header and a checksum to a data payload for transmission to the host;

a data-link layer coupled between the physical layer and the transport layer, the data-link layer adding a sequence number and a link-layer cyclical-redundancy-check (CRC) to transport-layer packets for transmission to the host;

a transmit Phase-Locked Loop (PLL) for generating a clock for synchronizing data sent over the transmit differential pair of lines to the host; and a receive Phase-Locked Loop (PLL) for generating a clock for synchronizing data received from the host over the receive differential pair of lines.

4. The partially-mapped flash-memory controller of claim 3 wherein the host interface comprises an Extended Universal-Serial-Bus (EUSB) interface, a Serial AT Attachment (SATA) interface, an Integrated Device Electronics (IDE) interface, or a Non-Volatile Memory Host Controller Interface (NVMHCI).

5. A partial-mapping method for writing to a flash memory comprising:

receiving a host command from a host along with a host logical-sector address (LSA) from the host;

dividing the host LSA into a set number, an entry number, a page number, and a sector number;

comparing a stored set number with the set number from the host LSA to determine when a logical-to-physical (L2P) table hit occurs, wherein the stored set number indicates which one of N sets of partial logical-to-physical mapping tables is currently stored in a volatile L2P mapping table, wherein N is a whole number of at least 64;

when the volatile L2P table hit occurs, using the entry number from the host LSA to locate a selected entry in the volatile L2P mapping table;

wherein a data buffer stores one page of data, and has a stored page number and a stored entry number of data last stored into the data buffer;

when the page number from the host LSA matches the stored page number, and the entry number from the host LSA matches the stored entry number, and the volatile L2P table hit occurs, writing host data associated with the host command into the data buffer and completing the host command;

when the volatile L2P table hit occurs and the page number from the host LSA mis-matches the stored page number, or the volatile L2P table hit occurs and the entry number from the host LSA mis-matches the stored entry number, signaling a buffer miss; and when the buffer miss is signaled, reading the data buffer and writing the buffered host data from the data buffer into a target physical block in the flash memory, the target physical block located by reading a physical-block address (PBA) from an old entry in the volatile L2P mapping table, the old entry identified by the stored entry number, and writing new host data associated with the host command into the data buffer and completing the host command, whereby one of the N sets of partial logical-to-physical mapping tables from flash memory is currently stored in the volatile L2P mapping table allowing the volatile L2P table hit to write host data to the data buffer.

6. The partial-mapping method of claim 5 further comprising:
setting a page-resident bit in the selected entry in the volatile L2P mapping table;
wherein the page-resident bit that is set identifies the page number from the host LSA, whereby page-resident bits are set in entries in the volatile L2P mapping table.

7. The partial-mapping method of claim 6 further comprising:
when the buffer miss is signaled, examining the page-resident bits in the old entry in the volatile L2P mapping table to determine when the page number from the host LSA is not a maximum of page numbers corresponding to the page-resident bits set for the old entry, and signaling an out-of-page-order flush when page number from the host LSA is not the maximum of page numbers;
when the out-of-page-order flush is signaled:
locating an empty physical block in the flash memory using wear-leveling counters that indicate a number of erasures of a physical block;
reading an old PBA from the old entry and using the old PBA to read old pages from an old physical block in the flash memory;
writing in page-number-order the old pages to the empty physical block for pages having a page number that is lower than the stored page number;
writing the data stored in the data buffer to the empty physical block after old pages having the page number that is lower than the stored page number have been written to the empty physical block;
writing in page-number-order the old pages to the empty physical block for pages having a page number that is greater than the stored page number after the data from the data buffer has been written to the empty physical block;
writing a new PBA that identifies the empty physical block to the old entry in the volatile L2P mapping table; and
erasing the old physical block in the flash memory after the old pages have been read,
whereby old pages are re-ordered with the data stored in the data buffer when the out-of-page-order flush is signaled.

8. The partial-mapping method of claim 5 further comprising:
when the host command is a read command and the volatile L2P table hit occurs:
reading a physical block address (PBA) from the selected entry;
using the PBA to read requested data from the flash memory;
sending the requested data to the host.

9. The partial-mapping method of claim 5 further comprising:
when the volatile L2P table hit does not occur, signaling a volatile L2P table miss;
using the set number to locate a new set in N sets of partial logical-to-physical mapping tables that are stored in flash memory, and reading the new set from flash memory and writing the new set to the volatile L2P mapping table,
whereby the set number locates the new set in flash memory that is copied to the volatile L2P mapping table.

10. The partial-mapping method of claim 9 further comprising:
when the volatile L2P table hit does not occur, signaling a volatile L2P table miss;
examining a L2P modified flag that indicates when entries in the volatile L2P mapping table have been modified;
when the L2P modified flag is set, using the stored set number to locate a physical block of tables in the flash memory, and reading an old set from the volatile L2P mapping table and writing the old set to the physical block of tables in the flash memory,
whereby the old set is flushed to flash memory before over-writing the volatile L2P mapping table.

11. The partial-mapping method of claim 10 further comprising:
when the physical block of tables in the flash memory has no empty pages:
locating an empty physical block of tables in the flash memory using wear-leveling counters that indicate a number of erasures of a physical block;
writing the old set from the volatile L2P mapping table to the empty physical block of tables in flash memory; and
erasing the physical block of tables in the flash memory that had no empty pages.

12. The partial-mapping method of claim 5 further comprising:
wherein when a wear-leveling counter reaches a wear threshold value, performing static wear-leveling by moving static data from a least-worn physical block having a lowest wear-leveling count value to a most-worn empty physical block having the wear-leveling counter reaching the wear threshold value,
whereby static wear-leveling moves static data from the least-worn physical block to the most-worn empty physical block to make the least-worn physical block available for use by dynamic data.

13. The partial-mapping method of claim 12 wherein static data from the least-worn physical block is a master-boot record (MBR) that is not modified.

14. The partial-mapping method of claim 5 further comprising:
storing the host command into a command queue;
combining entries in the command queue for host commands that have overlapping host data to reduce a number of host commands writing to the flash memory,
whereby entries in the command queue are combined when host data is overlapping.

* * * * *